US010910345B2

United States Patent
Shih et al.

(10) Patent No.: US 10,910,345 B2
(45) Date of Patent: Feb. 2, 2021

(54) SEMICONDUCTOR DEVICE WITH STACKED DIE DEVICE

(71) Applicant: NANYA TECHNOLOGY CORPORATION, New Taipei (TW)

(72) Inventors: Chiang-Lin Shih, New Taipei (TW); Pei-Jhen Wu, Taipei (TW); Ching-Hung Chang, Taoyuan (TW); Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/401,587

(22) Filed: May 2, 2019

(65) Prior Publication Data
US 2020/0350284 A1   Nov. 5, 2020

(51) Int. Cl.
*H01L 23/48*    (2006.01)
*H01L 25/065*   (2006.01)
*H01L 23/528*   (2006.01)
*H01L 23/00*    (2006.01)
*H01L 23/498*   (2006.01)

(52) U.S. Cl.
CPC .... *H01L 25/0657* (2013.01); *H01L 23/49816* (2013.01); *H01L 23/528* (2013.01); *H01L 24/14* (2013.01); *H01L 24/95* (2013.01)

(58) Field of Classification Search
None
See application file for complete search history.

(56) References Cited

U.S. PATENT DOCUMENTS

| 2010/0252934 A1* | 10/2010 | Law ................. H01L 21/76877 257/774 |
| 2015/0311117 A1 | 10/2015 | Lin et al. |
| 2018/0019187 A1 | 1/2018 | Lagouge et al. |
| 2018/0025970 A1* | 1/2018 | Kao ..................... H01L 27/088 257/401 |
| 2018/0286846 A1 | 10/2018 | Lin |
| 2019/0027457 A1 | 1/2019 | Lin |

FOREIGN PATENT DOCUMENTS

TW           201729303 A      8/2017

* cited by examiner

*Primary Examiner* — Hung K Vu
(74) *Attorney, Agent, or Firm* — Muncy, Geissler, Olds & Lowe, P.C.

(57) ABSTRACT

The present disclosure provides a semiconductor device and a method of manufacturing the same. The semiconductor device includes a first die, a second die, a first redistribution layer, a second redistribution layer, a first interconnect structure, and a second interconnect structure. The second die is stacked on the first die, the first redistribution layer is disposed between a first substrate of the first die and a second ILD layer of the second die, and the second redistribution layer is disposed on a second substrate of the second die. The first interconnect structure connects the first redistribution layer to one of first metal lines of the first die, and the second interconnect structure connects the second redistribution layer to one of the second metal lines in the second ILD layer.

7 Claims, 25 Drawing Sheets

SEMICONDUCTOR DEVICE WITH STACKED DIE DEVICE

TECHNICAL FIELD

The present disclosure relates to a semiconductor device and a method of manufacturing the same, and more particularly, to a stacked die device and method of manufacturing the same.

DISCUSSION OF THE BACKGROUND

As integrated circuit technologies continue to advance, ongoing efforts are made to increase performance and density, improve form factor, and reduce costs. One approach explored by designers to realize such benefits is the implementation of stacked three-dimensional (3D) integrated circuits. Some areas where 3D integrated circuits are suitable for consideration include stacking of two or more chips that are fabricated using different fabrication processes, or stacking of chips that are fabricated using the same fabrication processes to reduce the footprint of the integrated circuit apparatus.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device. The semiconductor device includes a first die, a second die, a first redistribution layer, a second redistribution layer, a first interconnect structure, and a second interconnect structure. The first die includes a first substrate, a first inter-layer dielectric (ILD) layer disposed on a front surface of the first substrate, and a plurality of first metal lines disposed in the first ILD layer. The second die is stacked on the first die. The second die includes a second substrate, a second ILD layer disposed on a second front surface of the second substrate, and a plurality of second metal lines disposed in the second ILD layer. The first redistribution layer is disposed between the first substrate and the second ILD layer. The second redistribution layer is disposed on the second substrate. The first interconnect structure penetrates through the first substrate and into the first ILD layer to connect the first redistribution layer to one of the first metal lines. The second interconnect structure penetrates through the second substrate and into the second ILD layer to connect the second redistribution layer to one of the second metal lines.

In some embodiments, the first redistribution layer is aligned with the first interconnect structure and is offset from the second metal line when viewed in a cross-sectional view.

In some embodiments, the second metal line physically connected to the first redistribution layer is exposed to the second ILD layer.

In some embodiments, the semiconductor device further includes at least one solder bump electrically coupled to the second redistribution layer.

In some embodiments, the semiconductor device further includes at least one under bump metallization (UBM) member sandwiched between the solder bump and the second redistribution layer.

In some embodiments, the semiconductor device further includes a carrier bonded to the first die through a bonding layer.

In some embodiments, the bonding layer comprises a native dielectric film grown on the carrier and a deposited dielectric layer on the first ILD layer.

In some embodiments, the first redistribution layer has a first thickness, and the second redistribution layer has a second thickness less than the first thickness.

Another aspect of the present disclosure provides a method of manufacturing a semiconductor device. The method includes steps of providing a first die comprising a first substrate, a first ILD layer disposed on a first front surface of the first substrate, and a plurality of first metal lines disposed in the first ILD layer; forming a first interconnect structure penetrating through the first substrate and into the first ILD layer and contacting one of the first metal lines; forming a first re-routing layer physically connected to the first interconnect structure; providing a second die comprising a second substrate, a second ILD layer disposed on a second front surface of the second substrate, and a plurality of second metal lines in the second ILD layer; forming a second re-routing layer physically connected to one of the second metal lines; stacking the second die on the first die and physically connecting to the first re-routing layer to the second re-routing layer; forming a second interconnect structure penetrating through the second substrate and into the second ILD layer and contacting one of the second conductors; and forming a second redistribution layer on the second substrate and physically connected to the second interconnect structure.

In some embodiments, the first re-routing layer and the second re-routing layer have an identical pattern.

In some embodiments, the method further includes a step of forming a dielectric layer to surround the first redistribution layer and the second redistribution layer.

In some embodiments, the method further includes steps of providing a carrier; forming a dielectric film on the first ILD layer; and bonding the first die to the carrier wafer through the dielectric film.

In some embodiments, the method further includes a step of performing a grinding process to thin the carrier after the forming of the second redistribution layer.

In some embodiments, the forming of the first interconnect structure includes steps of forming at least one first opening to expose the first metal lines, and depositing a first conductive material in the first opening; and the forming of the second interconnect structure includes steps of forming a second opening to expose the second metal line, and depositing a second conductive material in the second opening.

In some embodiments, the method further includes steps of depositing a first barrier layer on the first substrate and in the first opening before the depositing of the first conductive material; performing a first planarizing process to remove portions of the first barrier layer and the first conductive material and thus expose the first substrate after the depositing of the first conductive layer; depositing a second barrier layer on the second substrate and in the second opening before the depositing of the second conductive material; and performing a second planarizing process to remove portions of the second barrier layer and the second conductive material and thus expose the second substrate after the depositing of the second conductive layer.

In some embodiments, the method further includes steps of performing a first thinning process to thin the first substrate before the forming of the first interconnect structure, and performing a second thinning process to thin the second substrate before the forming of the second interconnect structure.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
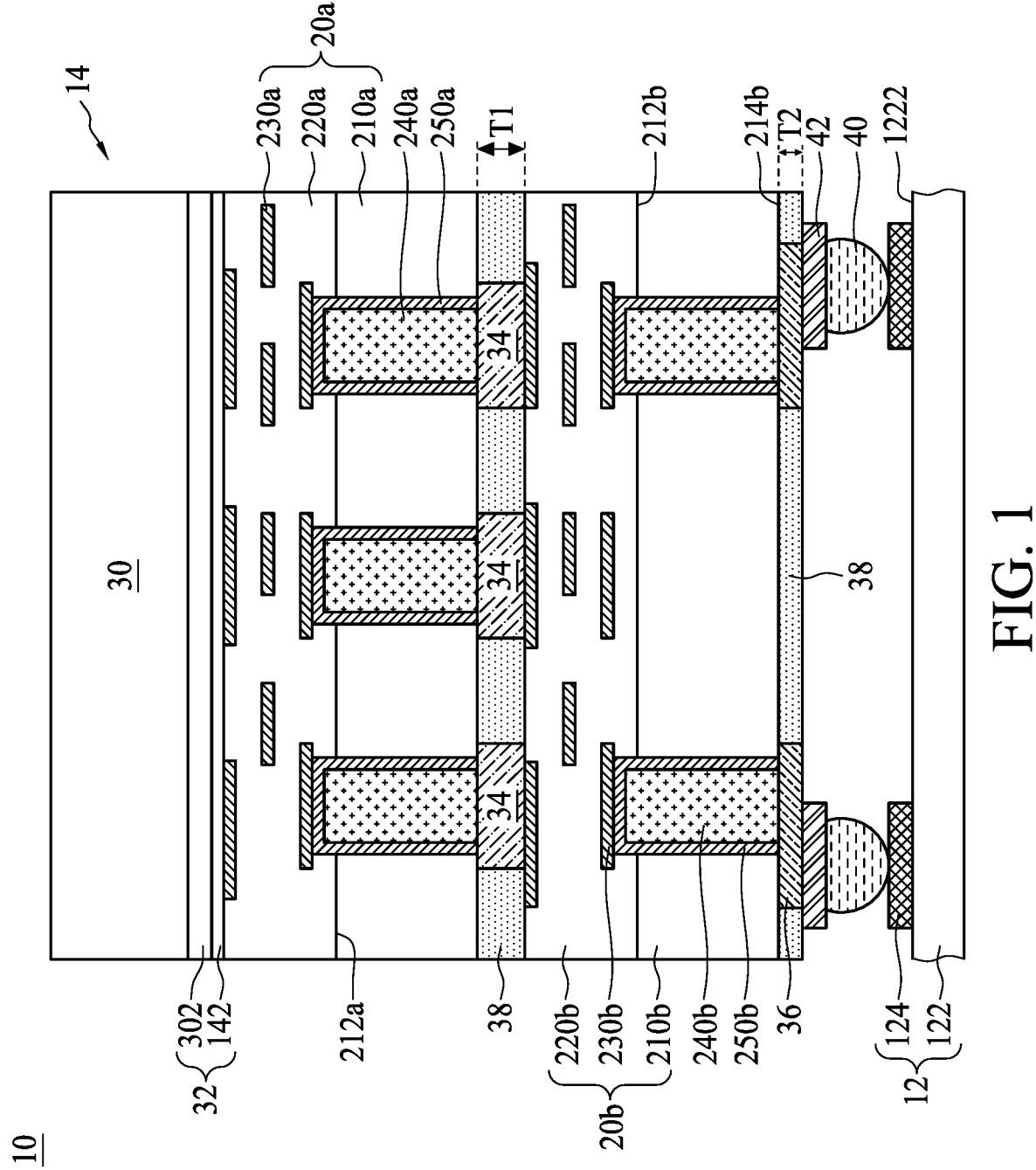
FIG. 1 is a cross-sectional view of a semiconductor system in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a cross-sectional view of a semiconductor system 10 in accordance with some embodiments of the present disclosure. Referring to FIG. 1, the semiconductor system 10 includes a main board 12 and a semiconductor device 14 mounted and electrically connected to the main board 12, wherein the semiconductor device 14 includes a first die 20a and a second die 20b vertically stacked in a front-to-back configuration.

In some embodiments, the main board 12 may be a circuit board or motherboard of an electronic system, such as a computer system. In some embodiments, the main board 12 includes a supporting member 122 and a plurality of wiring pads 124 disposed on a surface 1222 of the supporting member 122. In some embodiments, the supporting member 122 may be made of dielectric material, for example, BT resin or FR4 epoxy/glass, and the wiring pads 124 may be gold-plated conductors, copper-plated conductors, or aluminum-plated conductors.

In some embodiments, the semiconductor device 14 further includes a carrier 30, wherein the first die 20a is stacked and bonded to the carrier 30 by a dielectric-to-dielectric bonding process, wherein a bonding layer 32 may be sandwiched between the first die 20a and the carrier 30. In some embodiments, the carrier 30 may be a bare silicon wafer without any electrical circuitry disposed thereon. In some embodiments, the bonding layer 32 includes a deposited dielectric film 142, such as silicon dioxide ($SiO_2$) on the first die 20a and a native dielectric film 302 formed when the carrier 30 is exposed to oxygen and water in the air. In some embodiments, the deposited dielectric film 142 provides a high-quality bonding interface to facilitate a bonding with the carrier 30.

In some embodiments, the first die 20a and the second die 20b may be fabricated using the same fabrication process. For example, the first die 20a and the second die 20b may form a memory stack. However, in some embodiments, the first die 20a and the second die 20b may be fabricated using different fabrication processes. For example, one of the first die 20a and the second die 20b may be a memory device and the other of the first die 20a and the second die 20b may be a processor, an image sensor or an application-specific integrated circuit (ASIC) device.

The first die 20a includes a first substrate 210a and a first inter-layer dielectric (ILD) layer 220a disposed on a front surface 212a of the first substrate 210a. In some embodiments, the first substrate 210a may further include various layers that are not separately depicted and that combine to form various microelectronic elements that may include transistors, resistors, diodes, capacitors, inductors, fuses, other suitable elements, or combinations thereof. The various layers may include dielectric layers, gate layers, interfacial layers, diffusion/barrier layers, dielectric layers, conductive layers, other suitable layers, or combinations thereof. The various layers of the first substrate 210a may also include various doped regions, isolation features, other features, or combinations thereof. Moreover, such microelectronic elements may interconnect with one another to form a portion of the first substrate 210a, such as a logic device, a memory device, a radio frequency device, an input/output device, a system-on-chip device, other suitable type of device, or combinations thereof.

In some embodiments, the first ILD layer 220a covers the microelectronic elements, the doped regions and the isolation features. In some embodiments, the deposited dielectric film 142 is deposited on the first ILD layer 220a. In some embodiments, the first ILD layer 220a is a dielectric and may include oxide, nitride or oxynitride.

In some embodiments, the first die 20a further includes a plurality of first metal lines 230a disposed in the first ILD layer 220a. In some embodiments, the first metal lines 230a may be electrically coupled to the microelectronic elements and include aluminum (Al), copper (Cu), tungsten (W), titanium (Ti) or the like.

In some embodiments, the semiconductor device 14 further includes at least one first interconnect structure 240a physically connected to at least one of the first metal lines 230a. In some embodiments, the first interconnect structure 240a penetrates through the first substrate 210a and into the first ILD layer 220a and contacts the first metal line 230a proximal to the first substrate 210a. In some embodiments, the first interconnect structure 240a may include aluminum, copper, tungsten, cobalt (Co), polysilicon or other suitable conductive materials.

In some embodiments, the semiconductor device 14 may further include a first barrier layer 250a sandwiched between the first substrate 210a and the first interconnect structure 240a, between the first ILD layer 220a and the first interconnect structure 240a, and between the first metal line 230a and the first interconnect structure 240a. In some embodiments, the first barrier layer 250a acts as a glue layer. In some embodiments, refractory metals, refractory metal nitrides, refractory metal silicon nitrides and combinations thereof are typically used for the first barrier layer 250a. In some embodiments, the first barrier layer 250a may include titanium, titanium nitride (TiN), tantalum (Ta), tantalum nitride (TaN), titanium silicon nitride (TiSN), tantalum silicon nitride (TaSiN), or the like. In some embodiments, a seed layer (not shown) may be sandwiched between the first interconnect structure 240a and the first barrier layer 250a to facilitate forming of the first interconnect structure 240a.

The second die 20b includes a second substrate 210b, a second ILD layer 220b disposed on a second front surface 212b of the second substrate 210b, and a plurality of second metal lines 230b disposed in the second ILD layer 220b. In some embodiments, the second substrate 210b may further include various layers that are not separately depicted and that combine to form various microelectronic elements, doped regions and isolation features covered by the second ILD layer 220b. In some embodiments, some of the second metal lines 230b are exposed through the second ILD layer 220b for providing a landing area of a first redistribution layer 34, as will be described below.

In some embodiments, the semiconductor device 14 further includes at least one second interconnect structure 240b extending from a second back surface 214b, opposite to the second front surface 212b, to one of the second metal lines 230b. In some embodiments, the semiconductor device 14 may further include a second barrier layer 250b encircling the second interconnect structure 240b and sandwiched between the second conductive via 240b and the corresponding second metal line 230b.

The first redistribution layer 34 between the first die 20a and the second die 20b connects the first interconnect structure 240a to the second metal line 230b. In other words, the first interconnect structure 240a connects the first metal line 230a to the first redistribution layer 34. In some embodiments, when viewed in a cross-sectional view, the first redistribution layer 34 is aligned with the first interconnect structure 240a and is offset from the corresponding second metal line 230b. In some embodiments, the first redistribution layer 34 may include aluminum, tungsten, cobalt, titanium, gold (Au), platinum (Pt) or a combination thereof.

In some embodiments, the semiconductor device 14 further includes a second redistribution layer 36 attached to the second interconnect structure 240b. In other words, the second interconnect structure 240b connects the second metal line 230b to the second redistribution layer 36. In some embodiments, the first redistribution layer 34 has a first thickness T1; and the second redistribution layer 36 has a second thickness T2, which is less than the first thickness T1.

In some embodiments, the semiconductor device 14 may further include a dielectric material 38 surrounding the first redistribution layer 34 and the second redistribution layer 36. The dielectric material 38 may increase mechanical strength of attachment between the first die 20a and the second die 20b and reduce corrosion of the first redistribution layer 34 and the second redistribution layer 36. In some embodiments, the dielectric material 38 may include oxide, such as silicon dioxide.

The semiconductor device 14 further includes at least one solder bump 40 electrically coupled to the second redistribution layer 36. In some embodiments, the solder bump 40 physically connected to the wiring pads 124 serves as input/output (I/O) connections to electrically connect the semiconductor device 14 to the main board 12. In some embodiments, the solder bump 40 is located in a position corresponding to the wiring pad 124 to make physical and electrical connection thereto. In some embodiments, the semiconductor device 14 may further include at least one under bump metallization (UBM) member 42 sandwiched between the second redistribution layer 36 and the solder bump 40. In some embodiments, the UBM member 42 includes aluminum.

Figure 2:
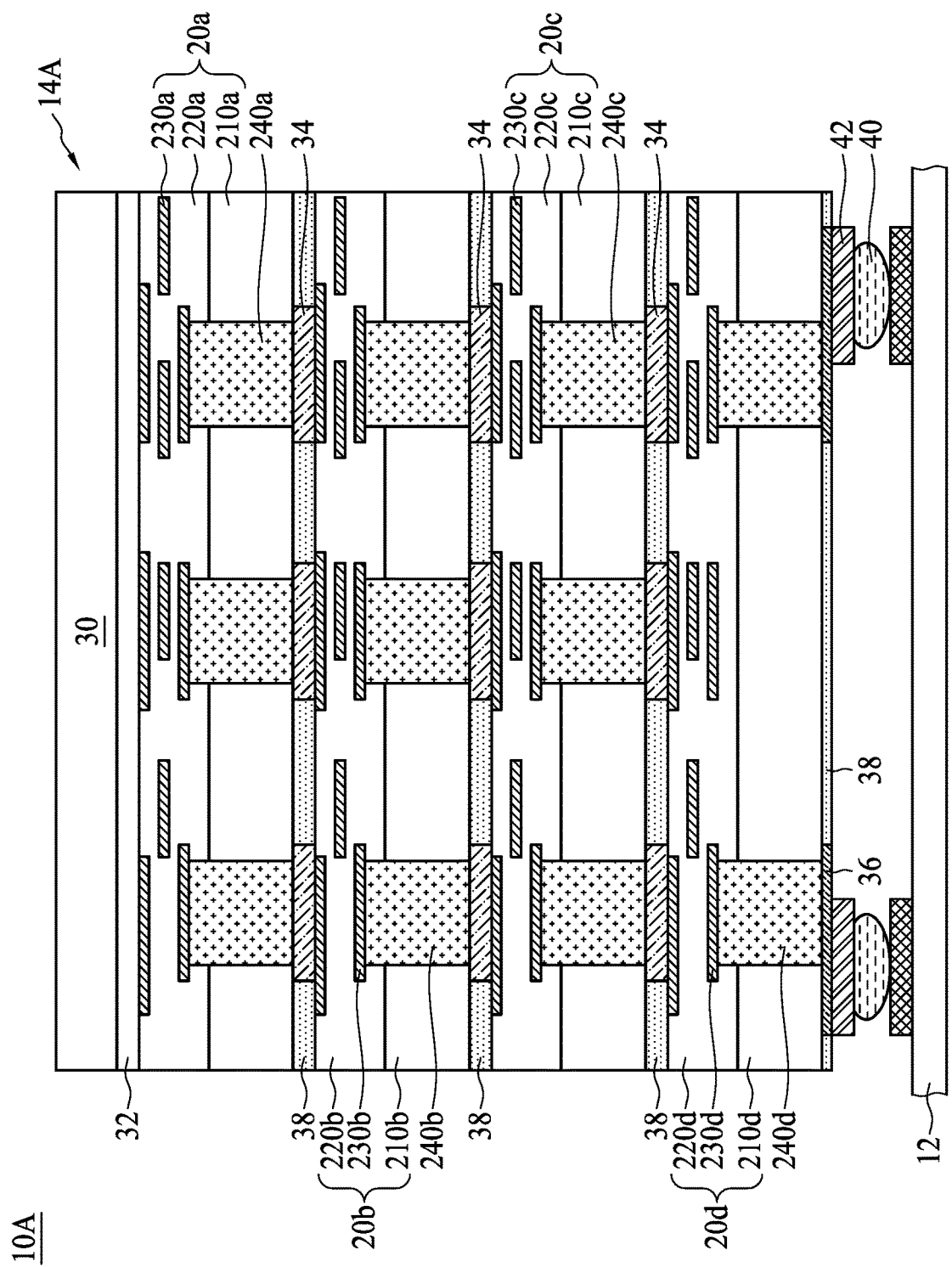
FIG. 2 is a cross-sectional view of a semiconductor system in accordance with some embodiments of the present disclosure.

FIG. 2 is a cross-sectional view of a semiconductor system 10A in accordance with some embodiments of the present disclosure. Referring to FIG. 2, the semiconductor system 10A includes a main board 12 and a semiconductor device 14A mounted on the main board 12 and including first to fourth dies 20a to 20d vertically stacked in a front-to-back configuration. Specifically, the third die 20c is stacked on the fourth die 20d, the second die 20b is stacked on the third die 20c, and the first die 20a is stacked on the second die 20b. In some embodiments, the first die 20a is bonded to a carrier 30 through a bonding layer 32, wherein the bonding layer 32 is disposed on a first ILD layer 220a of the first die 20a for providing a high-quality bonding interface. In some embodiments, the bonding layer 32 is in contact with some of first metal lines 230a exposed through the first ILD layer 220a.

In some embodiments, the semiconductor device 14A further includes a plurality of first redistribution layers 34 disposed between two adjacent dies 20a and 20b, 20b and 20c, and 20c and 20d. Specifically, one of the first distribution layers 34, between the first die 20a and the second die 20b, connects at least one of second metal lines 230b of the second die 20b to at least one first interconnect structure 240a; another first distribution layer 34, between the second die 20b and the third die 20c, connects at least one of third metal lines 230c of the third die 20c to at least one second interconnect structure 240b; and the other first distribution layer 34, between the third die 20c and the fourth die 20d, connects at least one of fourth metal lines 230d of the fourth die 20d to at least one third interconnect structure 240c.

In some embodiments, the semiconductor device 14A further includes a second redistribution layer 36 physically connected at least one fourth interconnect structure 240d of the fourth die 240d to one or more UBM members 42. In some embodiments, the semiconductor device 14A further includes one or more solder bumps 40 disposed on the UBM members 42 attached to the second redistribution layer 36. In some embodiments, a dielectric material 38 is applied between a first substrate 210a of the first die 20a and a second ILD layer 220b of the second die 20b, between a second substrate 210b of the second die 210b and a third ILD layer 220c of the third die 20c, and between a third substrate 210c of the third die 20c and a fourth ILD layer 220d of the fourth die 20d, and the dielectric material 38 surrounds the first redistribution layer 34. In some embodiments, the dielectric layer 38 is further applied on a fourth substrate 210d of the fourth die 20d and surrounds the second redistribution layer 36.

Figure 3:
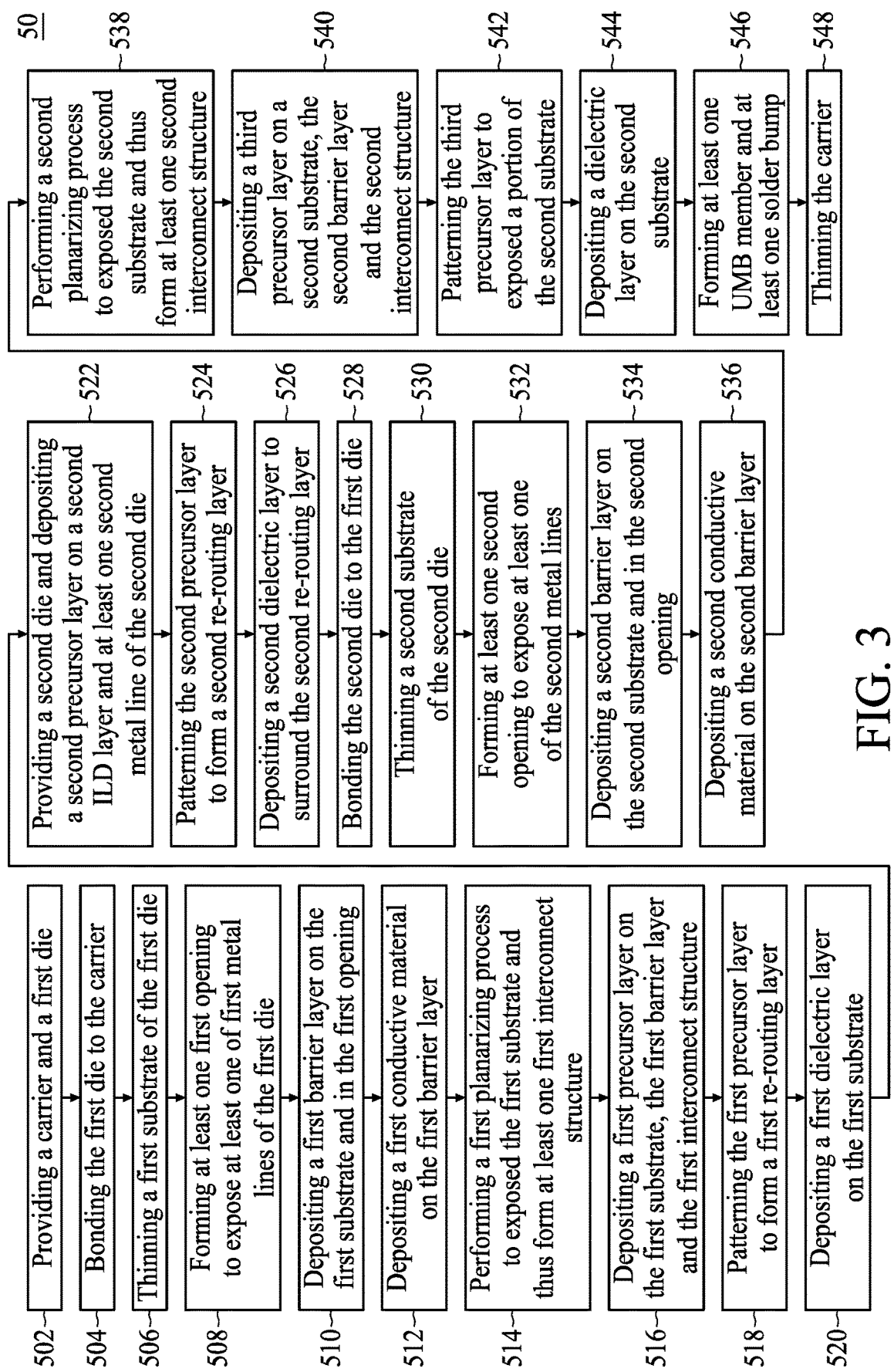
FIG. 3 is a flow diagram illustrating a method of manufacturing a semiconductor device in accordance with some embodiments of the present disclosure.

FIG. 3 is a flow diagram illustrating a method 50 of manufacturing a semiconductor device 14 in accordance with some embodiments of the present disclosure. FIGS. 4 to 25 are schematic diagrams illustrating various fabrication stages constructed according to the method 50 for manufacturing the semiconductor device 14 in accordance with some embodiments of the present disclosure. The stages shown in FIGS. 4 to 25 are also illustrated schematically in the flow diagram in FIG. 3. In the subsequent discussion, the fabrication stages shown in FIGS. 4 to 25 are discussed in reference to the process steps shown in FIG. 3.

Figure 4:
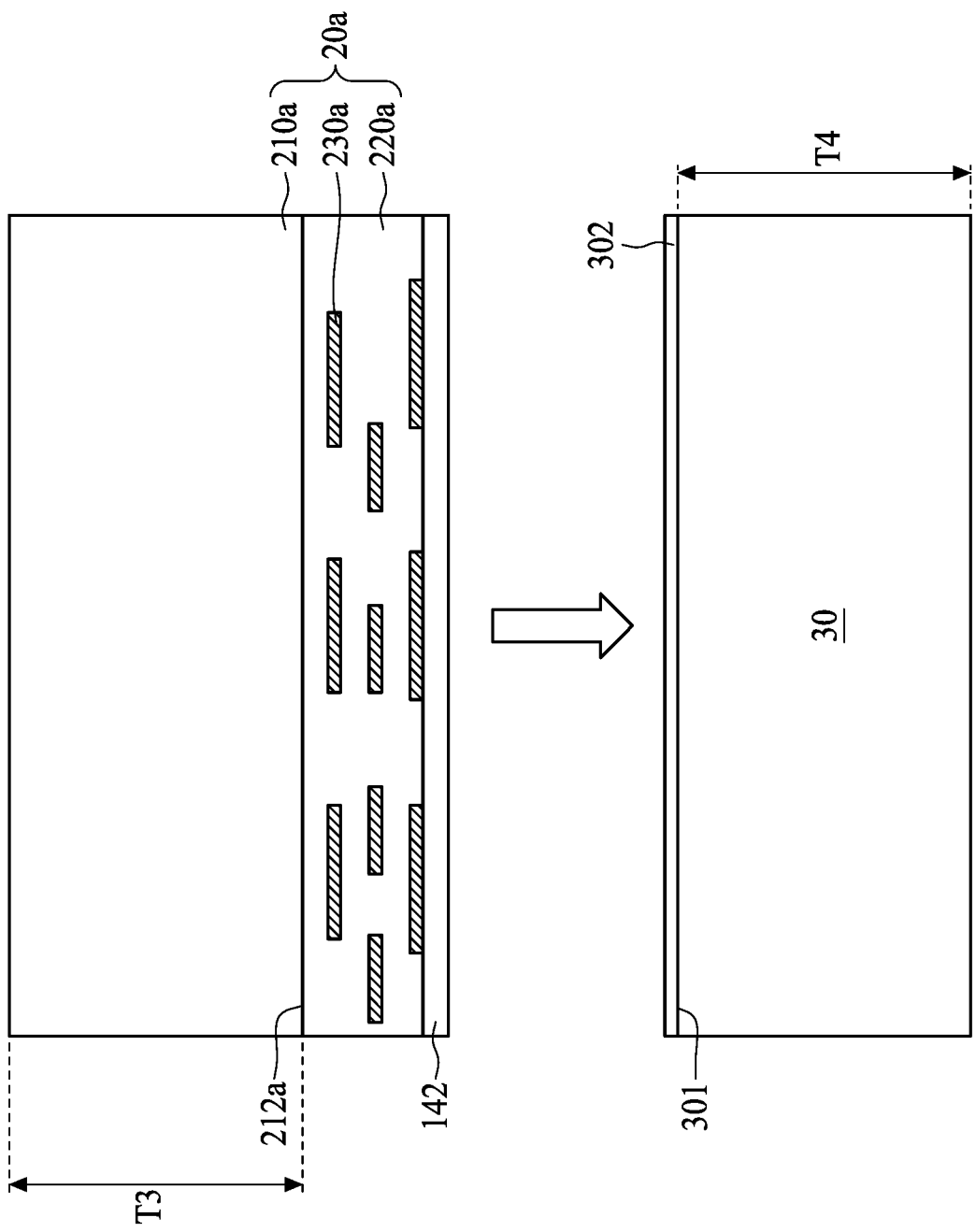
FIGS. 4 through 25 illustrate cross-sectional views of intermediate stages in the formation of a semiconductor device in accordance with some embodiments of the present disclosure.

Referring to FIG. 4, a first die 20a and a carrier 30 are provided according to a step 502 in FIG. 3. In some embodiments, the first die 20a includes a first substrate 210a, a first ILD layer 220a disposed on a front surface 212a of the first substrate 210a, and a plurality of first metal lines 230a disposed in the first ILD layer 220a. In FIG. 4, the first die 20a is arranged upside down such that the first ILD layer 220a faces the carrier 30. The first substrate 210a may be a doped bulk silicon, an undoped bulk silicon, or an active layer of a semiconductor-on-insulator (SOI) substrate, and may include various layers that are not separately depicted and that combine to form various microelectronic elements, doped regions and isolation features. In some embodiments, the first substrate 210a has an original thickness T3, which may be, for example, 775 μm.

In some embodiments, a dielectric film 142 including oxide is deposited, using a vapor deposition process, on the first ILD layer 220a. In some embodiments, a native dielectric film 302 is grown on a surface 301 of the carrier 30. In some embodiments, the carrier 30 has a thickness T4, which may be, for example, greater than 750 μm, such as 775 μm.

Figure 5:
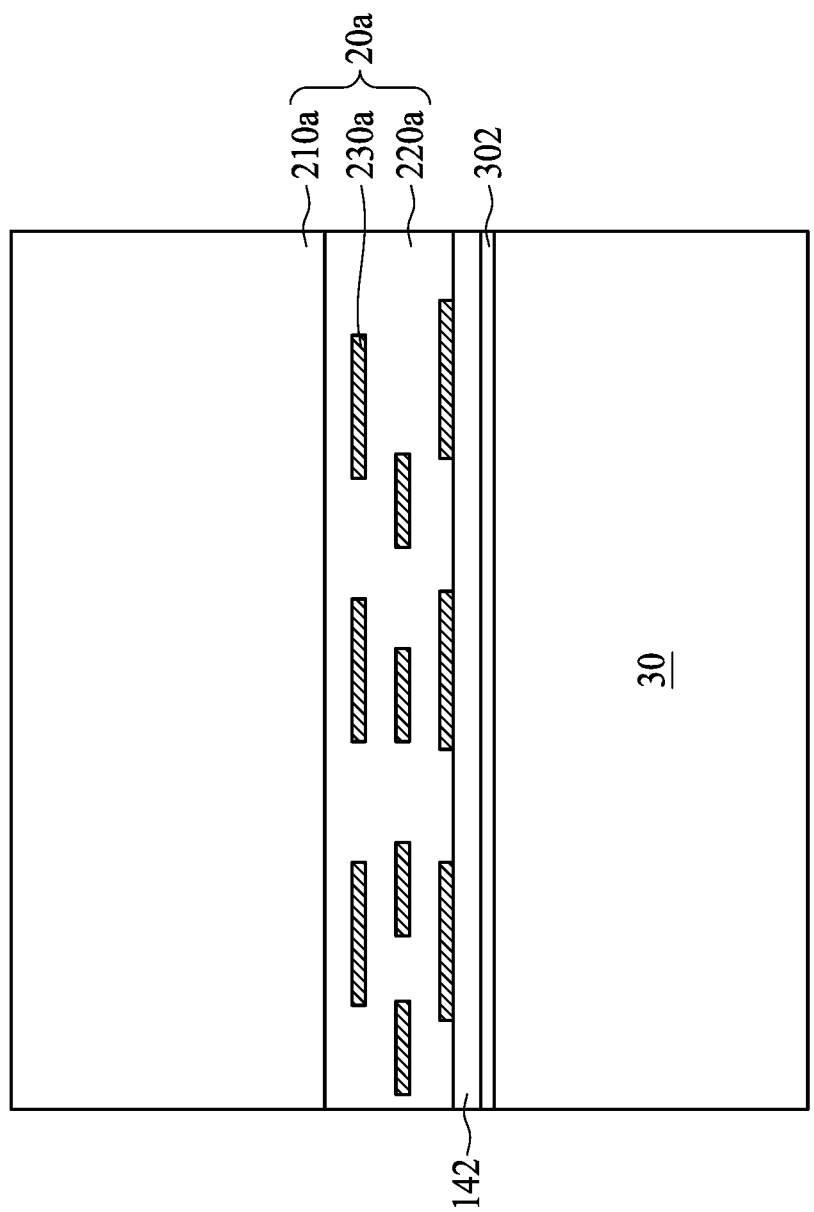

Referring to FIG. 5, in some embodiments, the first die 20a is bonded to the carrier 30 according to a step 504 in FIG. 3. In some embodiments, the first die 20a is bonded to the carrier 30 by a dielectric-to-dielectric bonding process, such as an oxide fusion bonding process.

Figure 6:
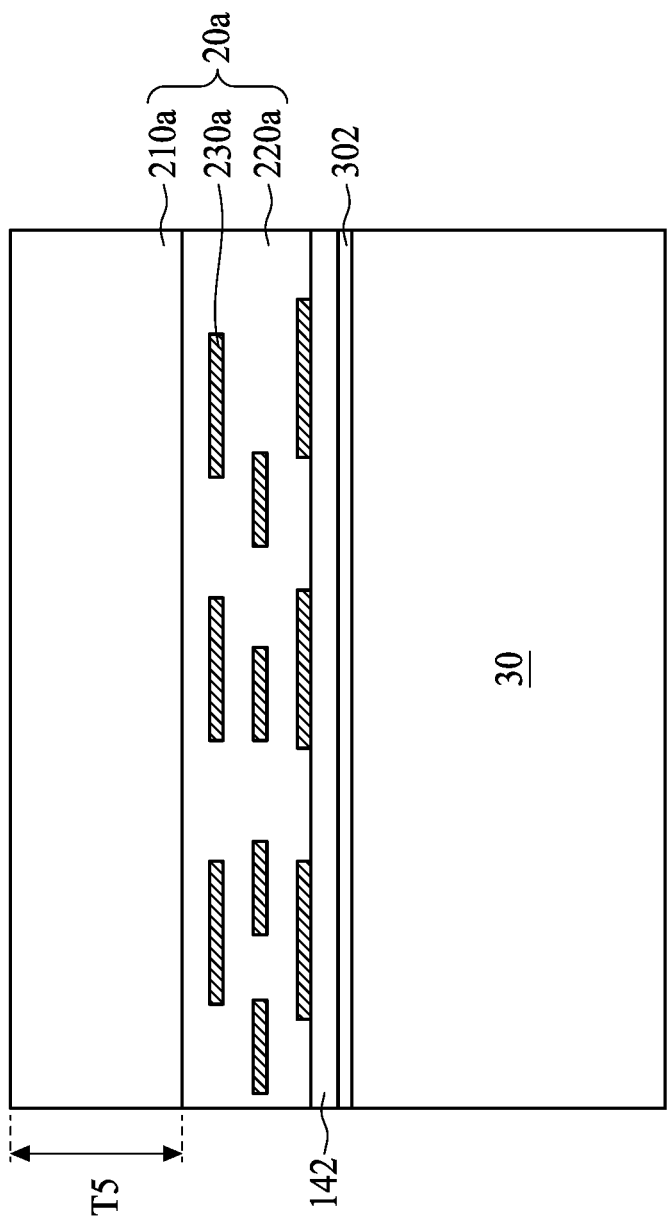

Referring to FIG. 6, in some embodiments, a first thinning process is performed to thin the first substrate 210a according to a step 506 in FIG. 3. In some embodiments, a portion of the first substrate 210a is removed such that the first die 20a is thinned. In FIG. 6, the first substrate 210a has thickness T5, which may be, for example, 50 μm. In some embodiments, the first thinning process may be implemented using suitable techniques such as a grinding process, a polishing process and/or a chemical etching process.

Figure 7:
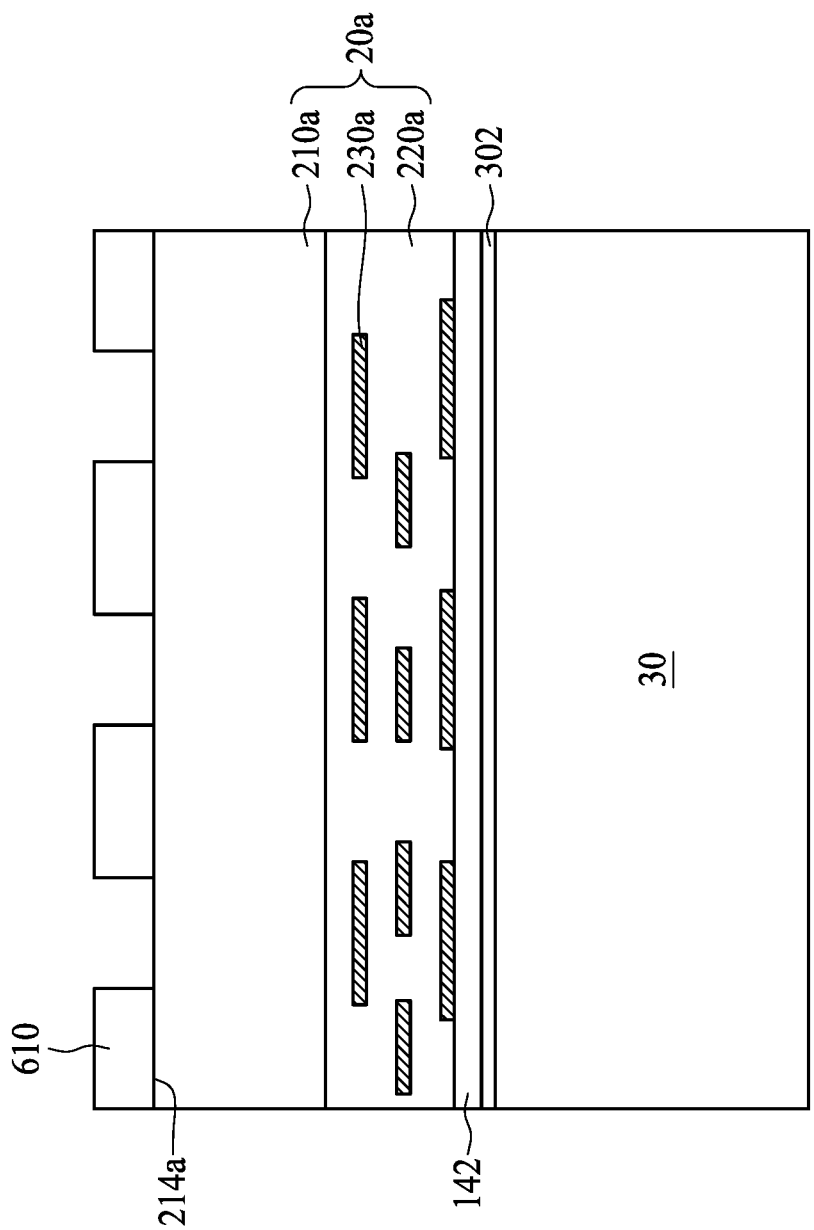
Figure 8:
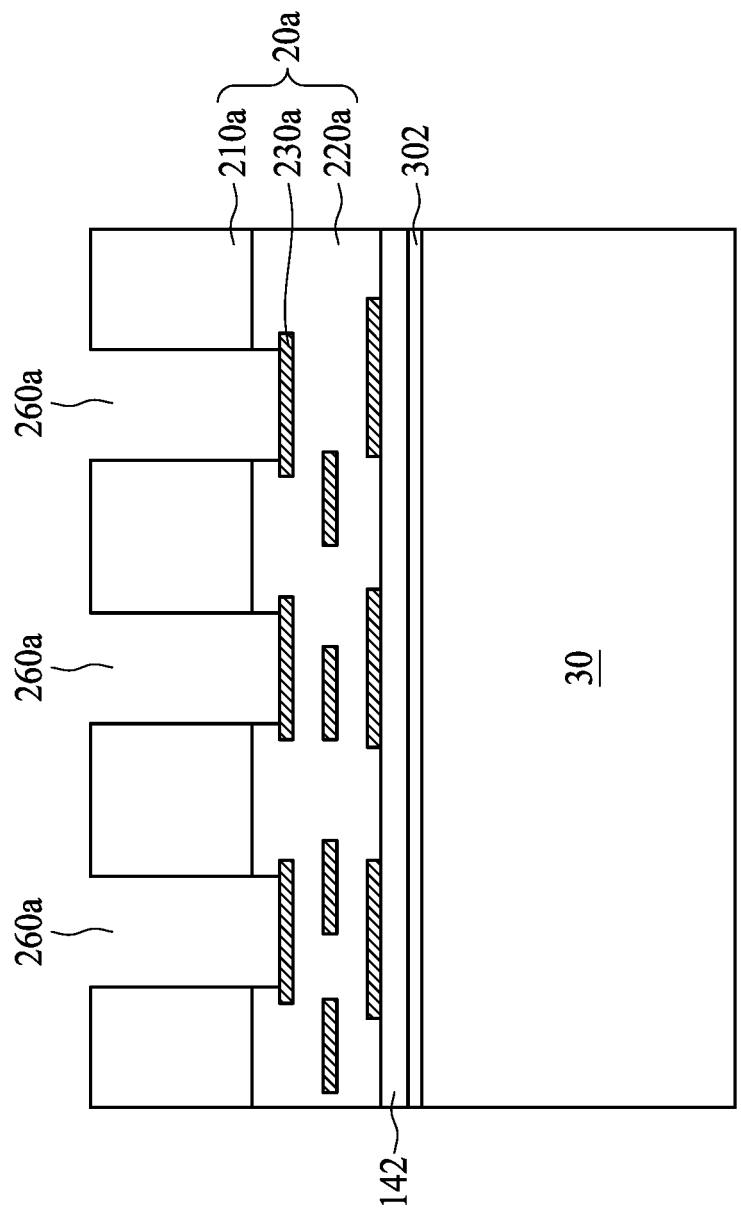

Referring to FIGS. 7 and 8, in some embodiments, one or more first openings 260a are formed to expose at least one of the first metal lines 230a according to a step 508 in FIG. 3. In some embodiments, the first openings 260a are formed by coating a first photoresist pattern 610 on a first back surface 214a of the first substrate 210a and performing a first etching process to remove portions of the first substrate 210a and the first ILD layer 220a. In some embodiments, the first photoresist pattern 610 may be formed by performing an exposure process and a develop process on a first photoresist material fully covering the first back surface 214a.

In some embodiments, portions of the first back surface 214a to be etched are exposed through the first photoresist pattern 610. In some embodiments, the first openings 260a stop at the first metal lines 230a. In some embodiments, the first etch process may utilize multiple etchants to etch the first substrate 210a and the first ILD layer 220a, wherein the etchants are selected based on the materials being etched. In some embodiments, the first substrate 210a and the first ILD layer 220a may be etched using a dry etching process, a wet etching process, a combination thereof, or any other suitable anisotropic etching process. After the first etching process is performed, the first photoresist pattern 610 is removed, for example, by an ashing process or a wet strip process, wherein the wet strip process may chemically alter the first photoresist pattern 610 so that it no longer adheres to the first substrate 210a.

Figure 9:
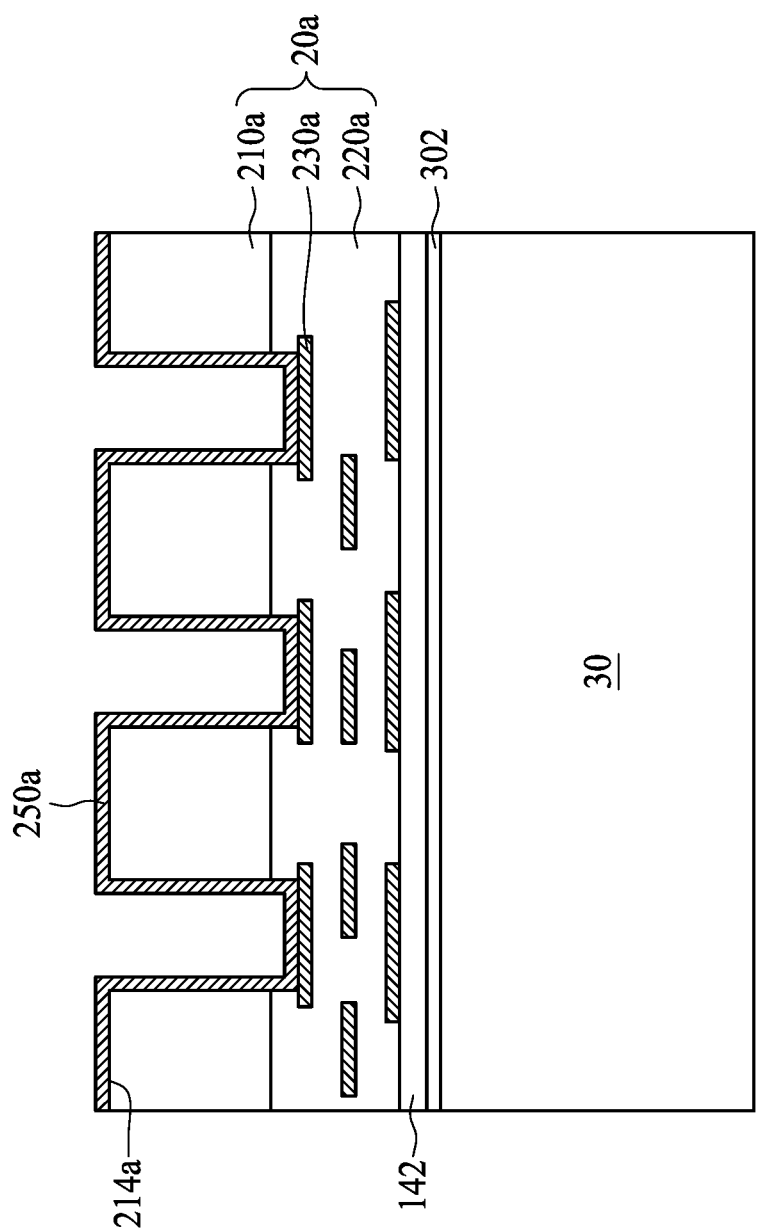

Referring to FIG. 9, in some embodiments, a first barrier layer 250a is optionally deposited on the first back surface 214a and in the first openings 260a according to a step 510 in FIG. 3. In some embodiments, the first barrier layer 250a is a substantially conformal layer. In some embodiments, the first barrier layer 250a is formed using a physical vapor deposition (PVD) process, for example.

Figure 10:
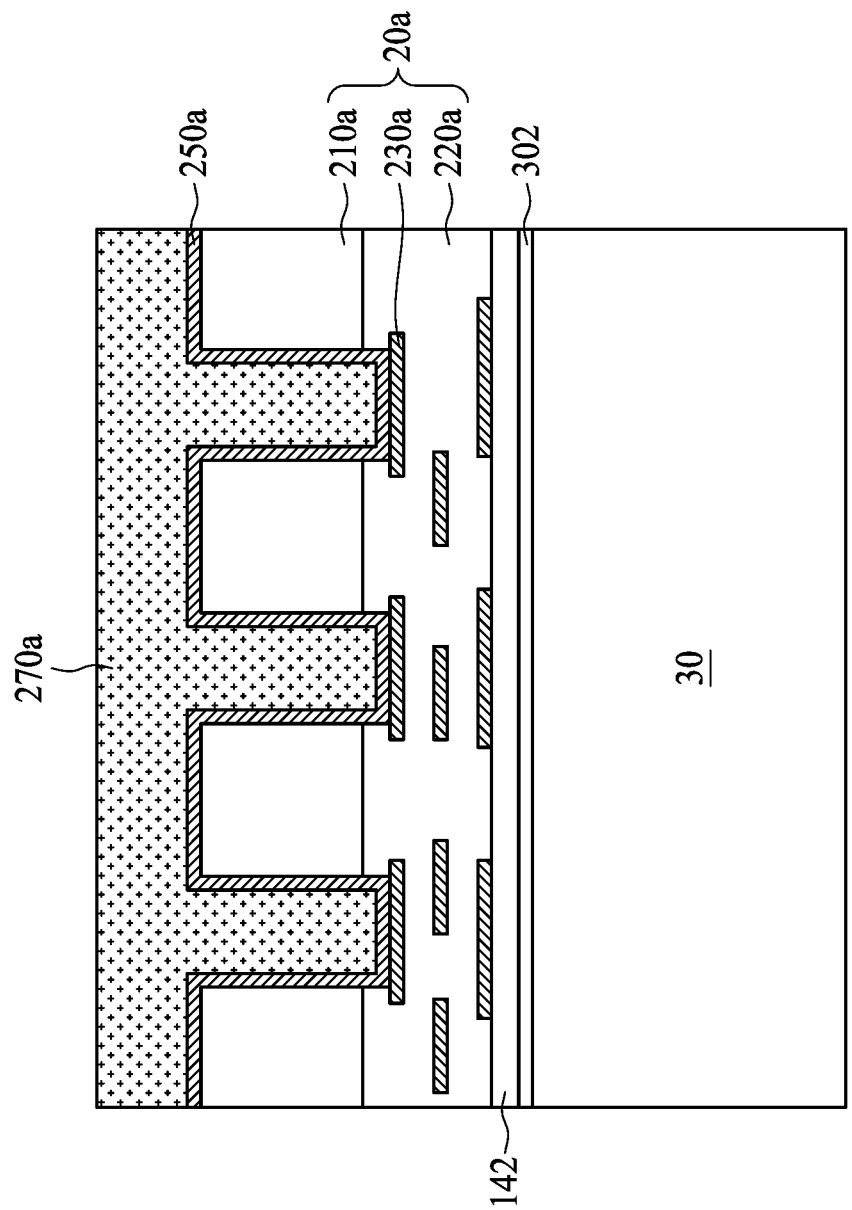

Referring to FIG. 10, in some embodiments, a first conductive material 270a is deposited on the first barrier layer 250a according to a step 512 in FIG. 3. In some embodiments, the first conductive material 270a has a thickness sufficient to fill the first openings 260a. In some embodiments, the first conductive material 270a is formed by an electroplating process or a CVD process.

Figure 11:
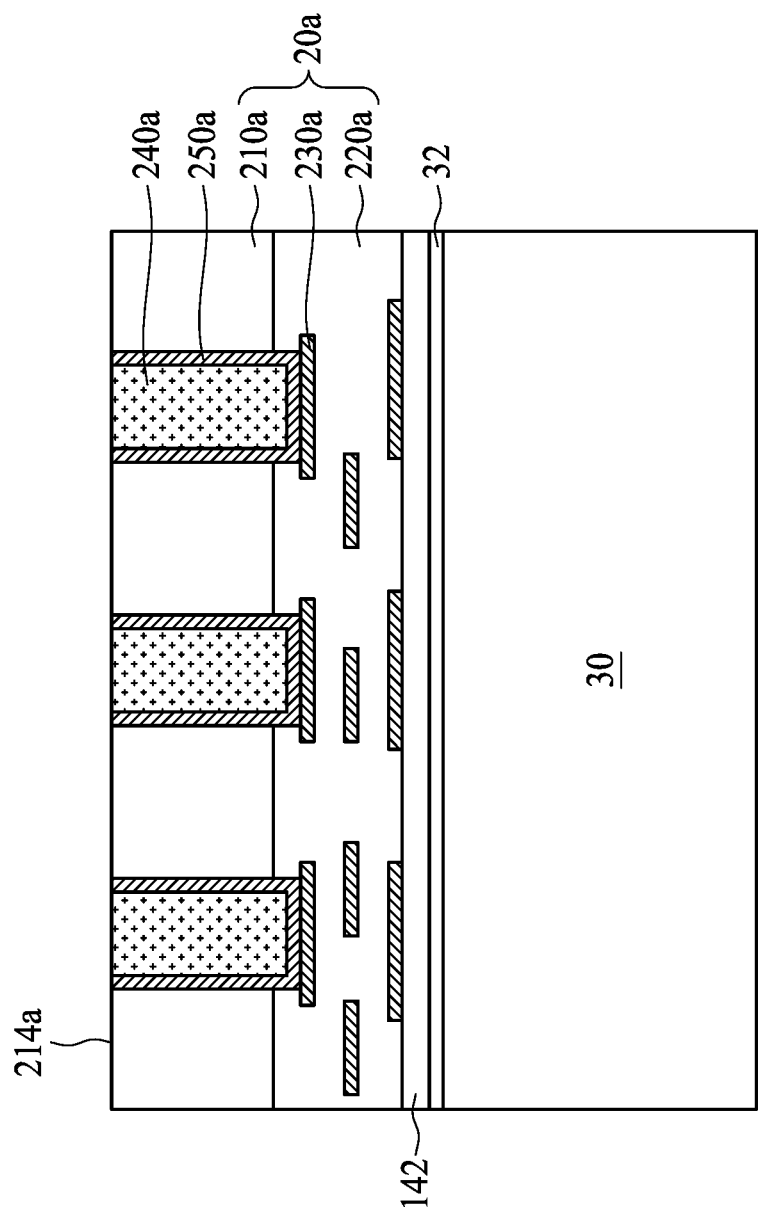

Referring to FIG. 11, in some embodiments, a first planarizing process is performed to expose the first substrate 210a according to a step 514 in FIG. 3. Accordingly, one or more interconnect structures 240a are formed. In some embodiments, the first barrier layer 250a and the first conductive material 270a are planarized to expose the first back surface 214a. In some embodiments, the first planarizing process includes a chemical mechanical polishing (CMP) process and/or wet etching process.

Figure 12:
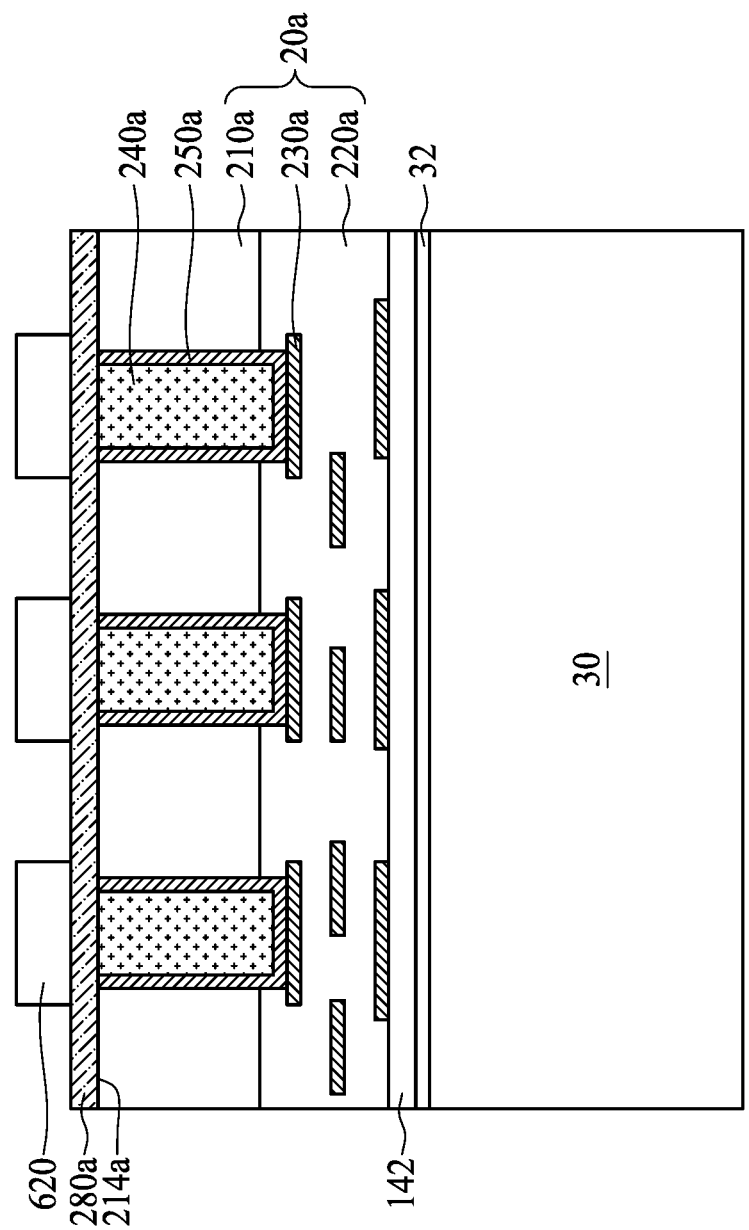

Referring to FIG. 12, in some embodiments, a first precursor layer 280a is deposited to cover the first back surface 214a, the first interconnect structures 240a and the first barrier layer 250a according to a step 516 in FIG. 3. In some embodiments, the first precursor layer 280a may be a metallic layer including aluminum, tungsten, cobalt, titanium, gold, platinum or alloys thereof. In some embodiments, the first precursor layer 280a is formed utilizing a CVD process, a PVD process, a sputtering process, an evaporation process or an electroplating process.

Next, a first mask 620 is provided on the first precursor layer 280a to pattern the first precursor layer 280a. In some embodiments, a portion of the first precursor layer 280a is exposed through the first mask 620, and the first interconnect structures 240a are disposed beneath the first mask 620.

Figure 13:
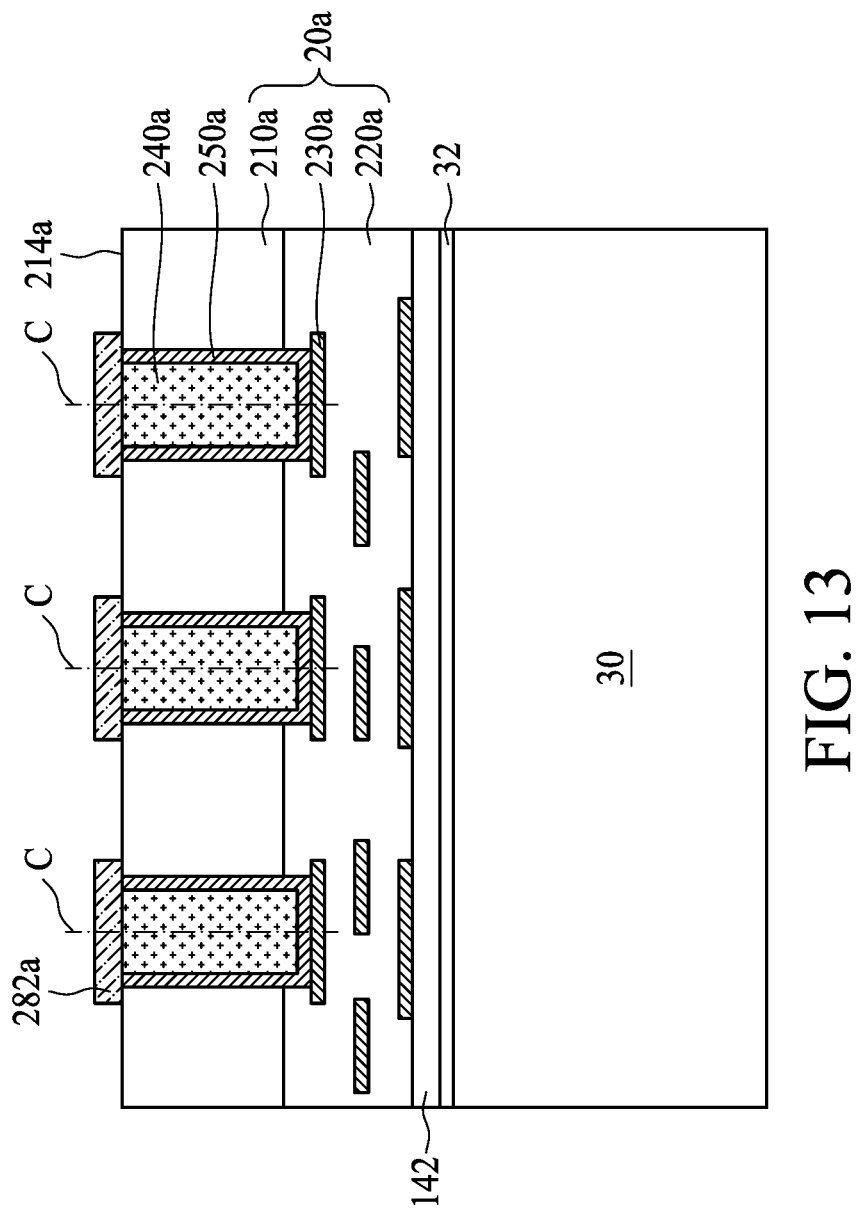

Referring to FIG. 13, in some embodiments, a first patterning process is performed to etch the first precursor layer 280a through the first mask 620 and thus form a first re-routing layer 282a according to a step 518 in FIG. 3. After the first patterning process is performed, the first mask 620 is removed. In some embodiments, the first re-routing layer 282a is formed by removing the portion of the first precursor layer 280a exposed through the first mask 620. In some embodiments, the first re-routing layer 282a may be centered on a central axis C of the first conductive structure 240a when viewed in a cross-sectional view. In some embodiments, portions of the first re-routing layer 282a cover the first back surface 214a.

Figure 14:
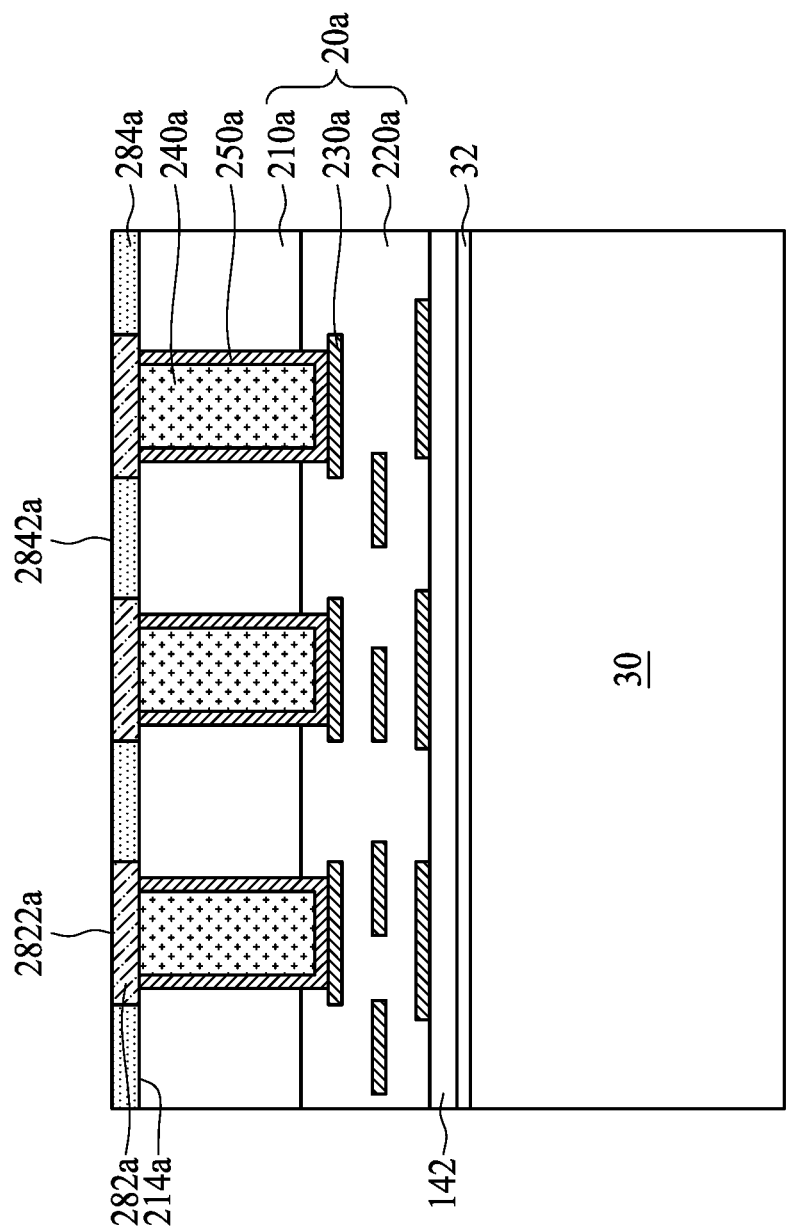

Referring to FIG. 14, in some embodiments, a first dielectric layer 284a is deposited on the first back surface 214a exposed through the first re-routing layer 282a according to a step 520 in FIG. 3. In some embodiments, the first dielectric layer 284a surrounds the first re-routing layer 282a. In some embodiments, the first re-routing layer 282a has a top surface 2822a, and the first dielectric layer 284a has a top surface 2842a coplanar with the top surface 2822a of the first re-routing layer 282a. In some embodiments, the first dielectric layer 284a may be formed using a CVD process.

Figure 15:
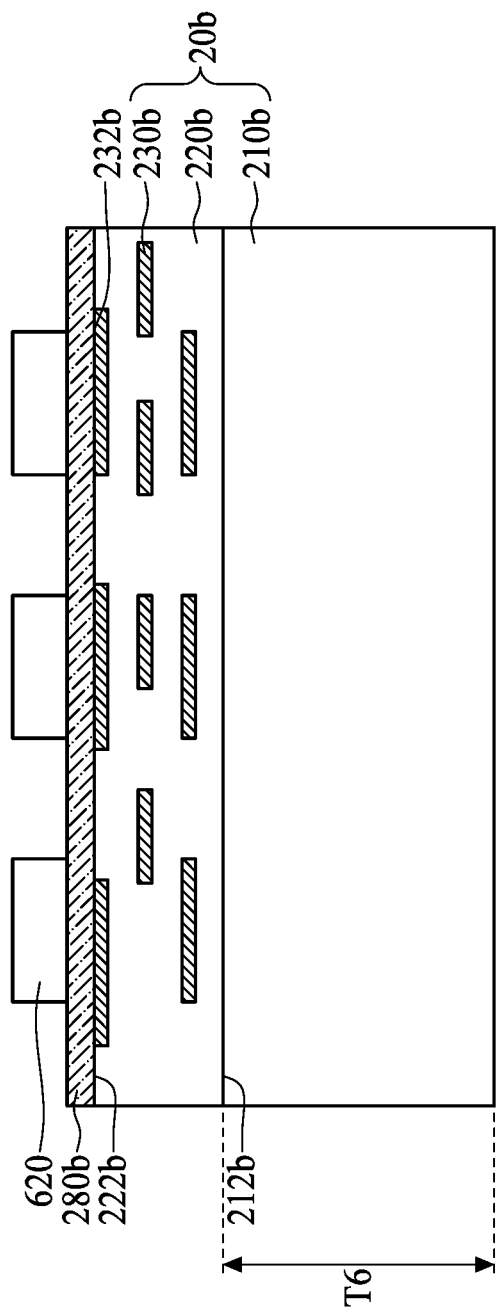

Referring to FIG. 15, in some embodiments, a second die 20b is provided according to a step 522 in FIG. 3. In some embodiments, the second die 20b includes a second substrate 210b, a second ILD layer 220b disposed on a second front surface 212b of the second substrate 210b, and a plurality of second metal lines 230b in the second ILD layer 220b, wherein at least one of the second metal lines 230b is exposed through the second ILD layer 220b. In some embodiments, the second metal line 230b exposed through the second ILD layer 220b has a top surfaces 232b that is coplanar with a top surface 222b of the second ILD layer 220b. In FIG. 15, the second substrate 210b has thickness T6, which is about 755 μm.

Next, a second precursor layer 280b is deposited on the top surfaces 222b, 232b. In some embodiments, the materials and formation methods of the second precursor layer 280b are essentially the same as those of the first precursor layer 280a.

Figure 16:
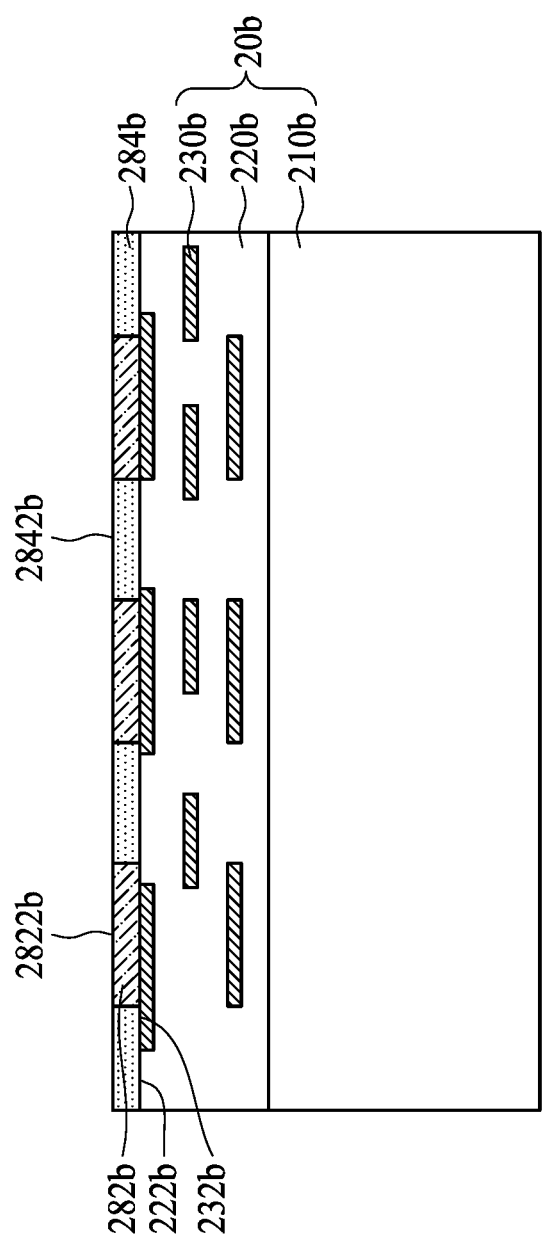

Next, the first mask 620 is provided on the second precursor layer 280b to define a pattern of a second re-routing layer 282b as shown in FIG. 16. In some embodiments, portions of the second metal lines 230b exposed to the second ILD layer 220b are disposed beneath the first mask 620.

Referring again to FIG. 16, in some embodiments, a second patterning process is performed to etch the second precursor layer 280b and thus form the second re-routing layer 282b according to a step 524 in FIG. 3. In some embodiments, the second re-routing layer 282b is formed by removing the portion of the second precursor layer 280b exposed through the first mask 620. After the second patterning process is performed, the first mask 620 is removed. In some embodiments, the first re-routing layer 282a and the second re-routing layer 282b have an identical pattern.

Referring again to FIG. 16, a second dielectric layer 284b is deposited to cover the top surfaces 222b, 232b exposed through the second re-routing layer 282b, and to surround the second re-routing layer 282b according to a step 526 in FIG. 3. In some embodiments, the second re-routing layer 282b has a top surface 2822b, and the second dielectric layer 284b has a top surface 2842b coplanar with the top surface 2822b of the second re-routing layer. In some embodiments, the materials and formation methods of the second dielectric layer 284b are essentially the same as those of the first dielectric layer 284a.

Figure 17:
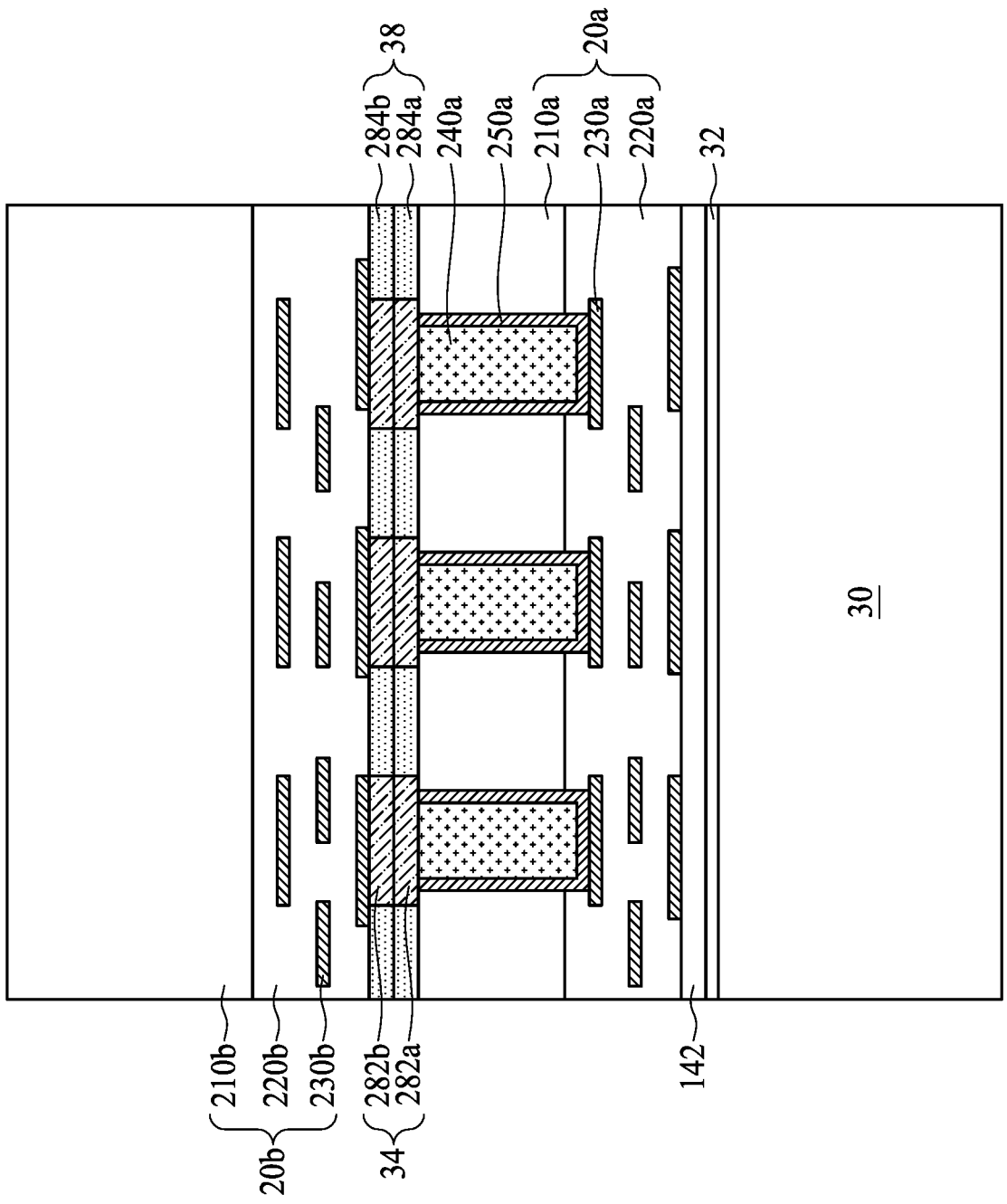

Referring to FIG. 17, in some embodiments, the second die 20b is stacked and bonded to the first die 20a according to a step 528 in FIG. 3. In some embodiments, the second die 20b is arranged upside down such that the second re-routing layer 282b faces the first re-routing layer 282a. After the bonding process is performed, the second re-routing layer 282b is directly connected to the first re-routing layer 282a, thus forming a first redistribution layer 34, and the second dielectric layer 284b is in contact with the first dielectric layer 284a, thus forming a dielectric material 38 between the first die 20a and the second die 20b. After the second die 20b and the first die 20a are bonded, an anneal process is performed to bond the first re-routing layer 282a to the second re-routing layer 282b and fuse the first dielectric layer 284a to the second dielectric layer 284b.

Figure 18:
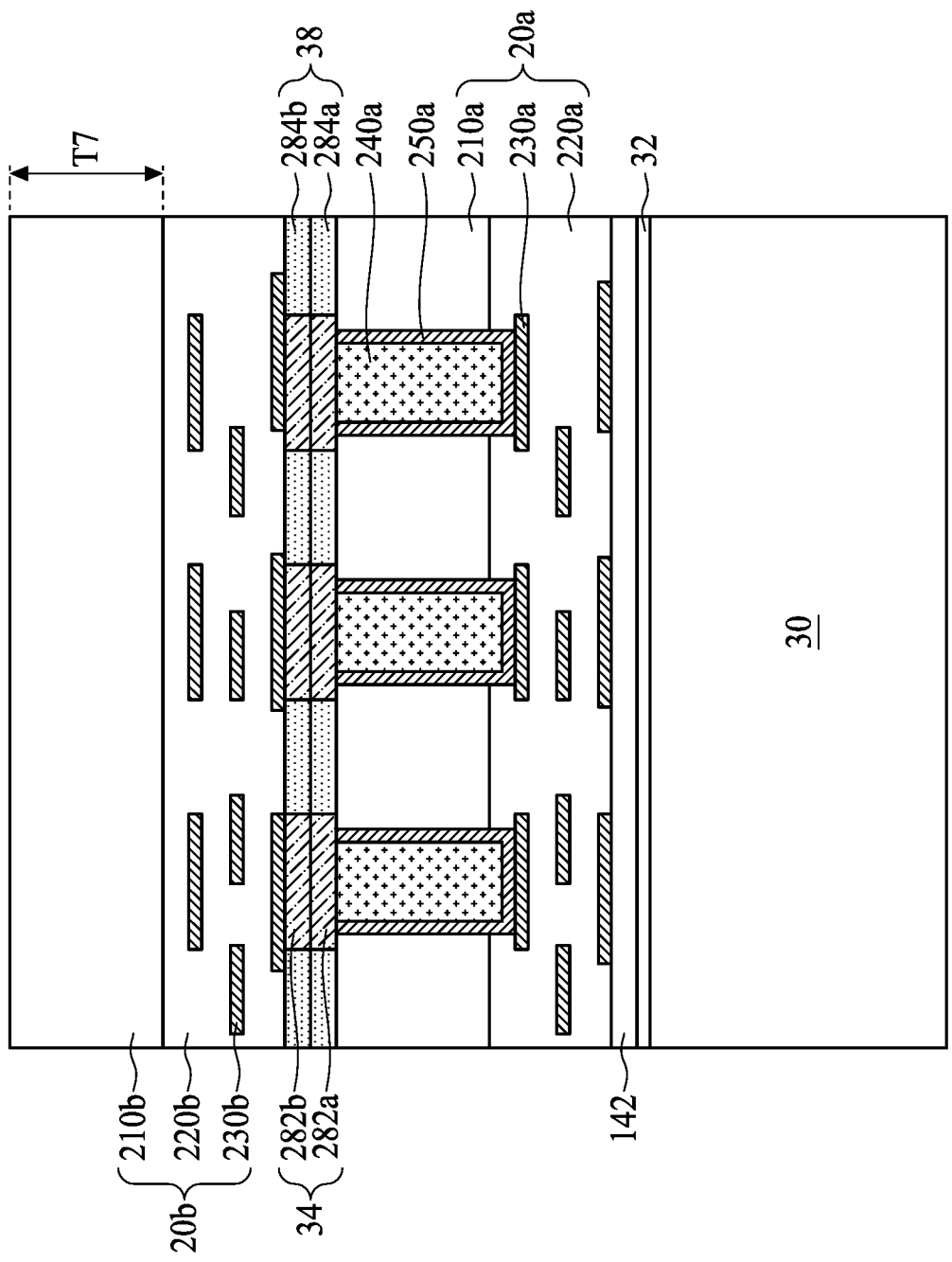

Referring to FIG. 18, in some embodiments, a second thinning process is performed to thin the second substrate 210b according to a step 530 in FIG. 3. In some embodiments, a portion of the second substrate 210b is removed such that the second die 20a is thinned. In FIG. 18, the second substrate 210b has thickness T7, which is about 50 μm.

Figure 19:
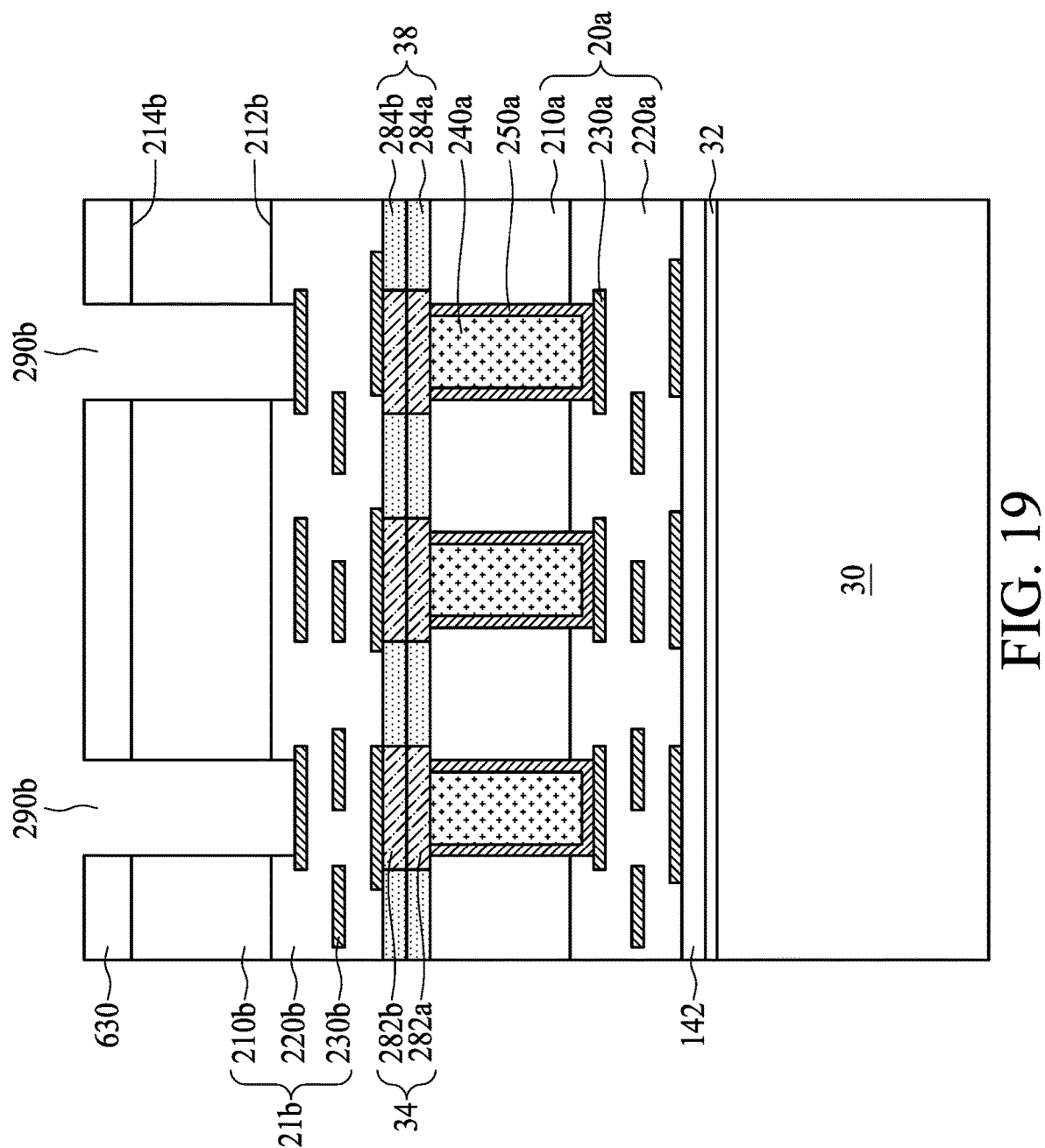

Referring to FIG. 19, in some embodiments, one or more second opening 290b are formed to expose at least one of the second metal lines 230b according to a step 532 in FIG. 3. In some embodiments, the second openings 290b are formed by coating a second photoresist pattern 630 on a second back surface 214b, opposite to the second front surface 212a, and performing a second etching process to remove portions of the second substrate 210b and the second ILD layer 220b that are not covered by the second photoresist pattern 630. After the second etching process is performed, the second photoresist pattern 630 is removed, for example, by an ashing process or a wet strip process.

Figure 20:
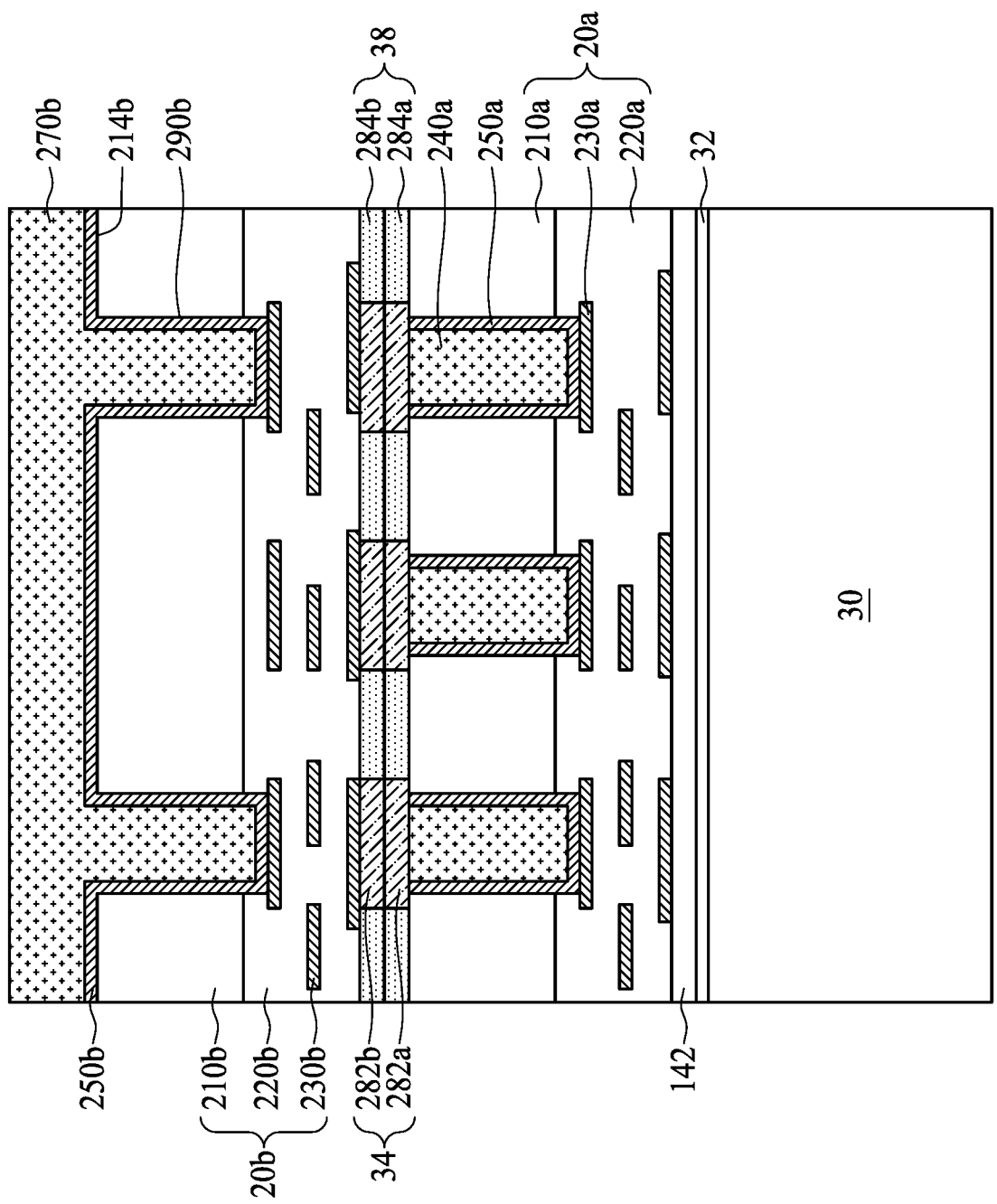

Referring to FIG. 20, in some embodiments, a second barrier layer 250b is optionally deposited on the second back surface 214b and in the second openings 290b according to a step 534 in FIG. 3. In some embodiments, the second barrier layer 250b has a substantially uniform thickness. The materials and formation methods of the second barrier layer 250b are essentially the same as those of the first barrier layer 250a.

Next, a second conductive material 270b is deposited on the second barrier layer 250b according to a step 536. In some embodiments, the second conductive material 270b has a thickness sufficient to fill the second openings 290b surrounded by the second barrier layer 250b. The materials and formation methods of the second conductive material 270b are essentially the same as those of the first conductive material 270a.

Figure 21:
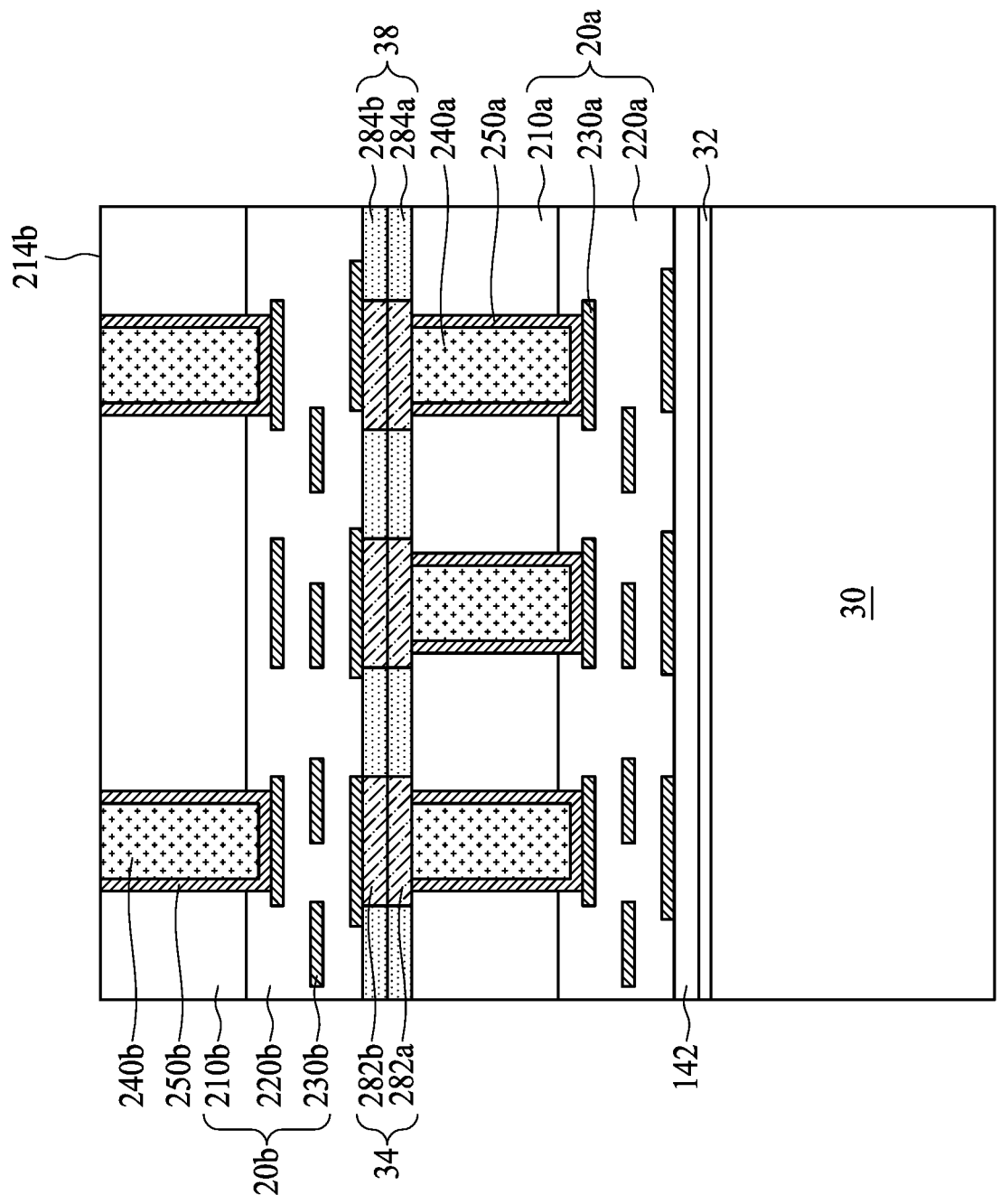

Referring to FIG. 21, in some embodiments, a second planarizing process is performed to expose the second substrate 210b according to a step 538 in FIG. 3. Accordingly, one or more second interconnect structure 240b are formed. During the second planarizing process, portions of the second barrier layer 250b and the second conductive material 270b are removed to expose the first back surface 214b.

Figure 22:
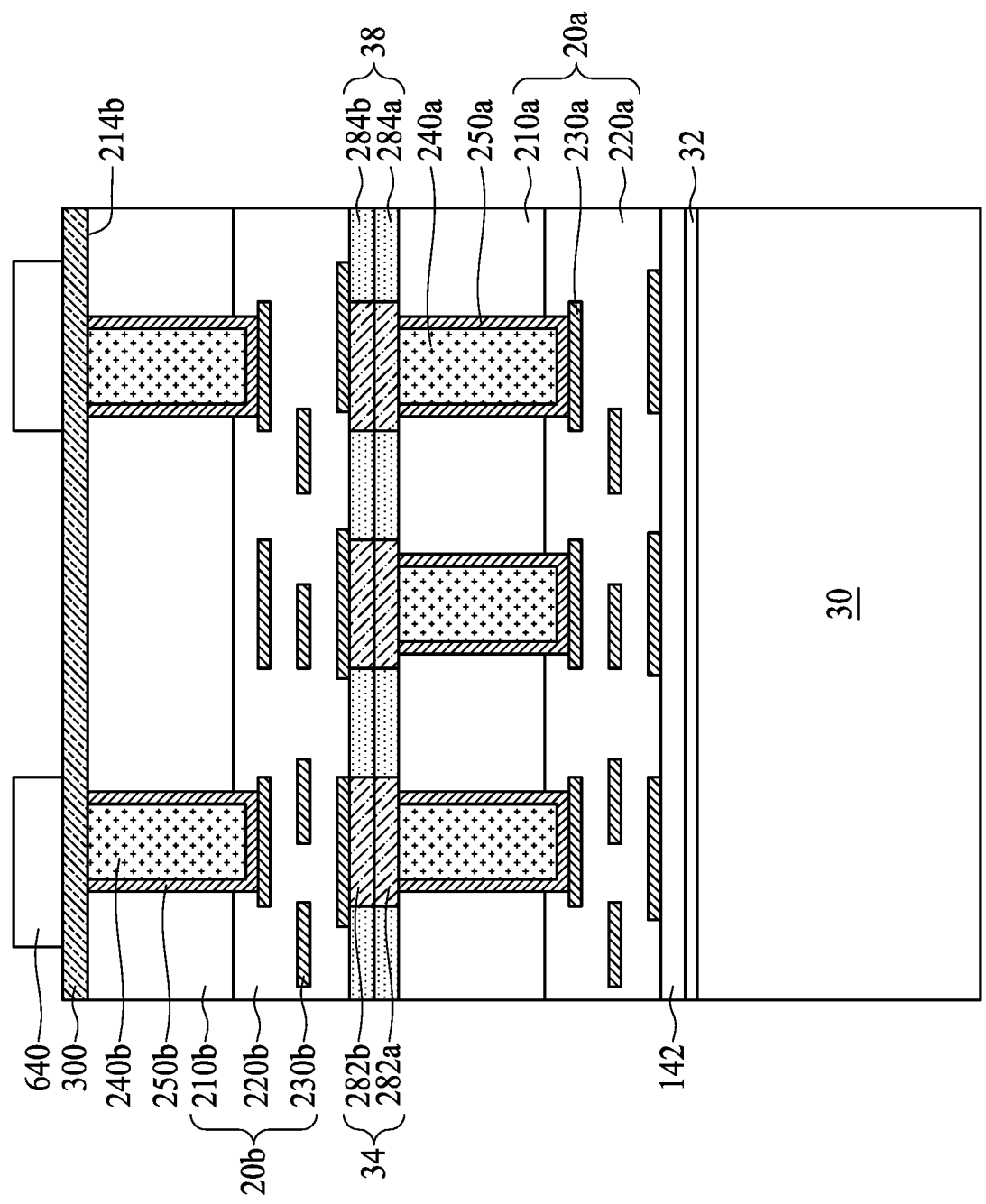

Referring to FIG. 22, in some embodiments, a third precursor layer 300 is deposited on the second back surface

214b, the second interconnect structures 240b and the second barrier layer 250b according to a step 540 in FIG. 3. In some embodiments, the materials and formation methods of the third precursor layer 300 are essentially the same as those of the first precursor layer 280a.

Figure 23:
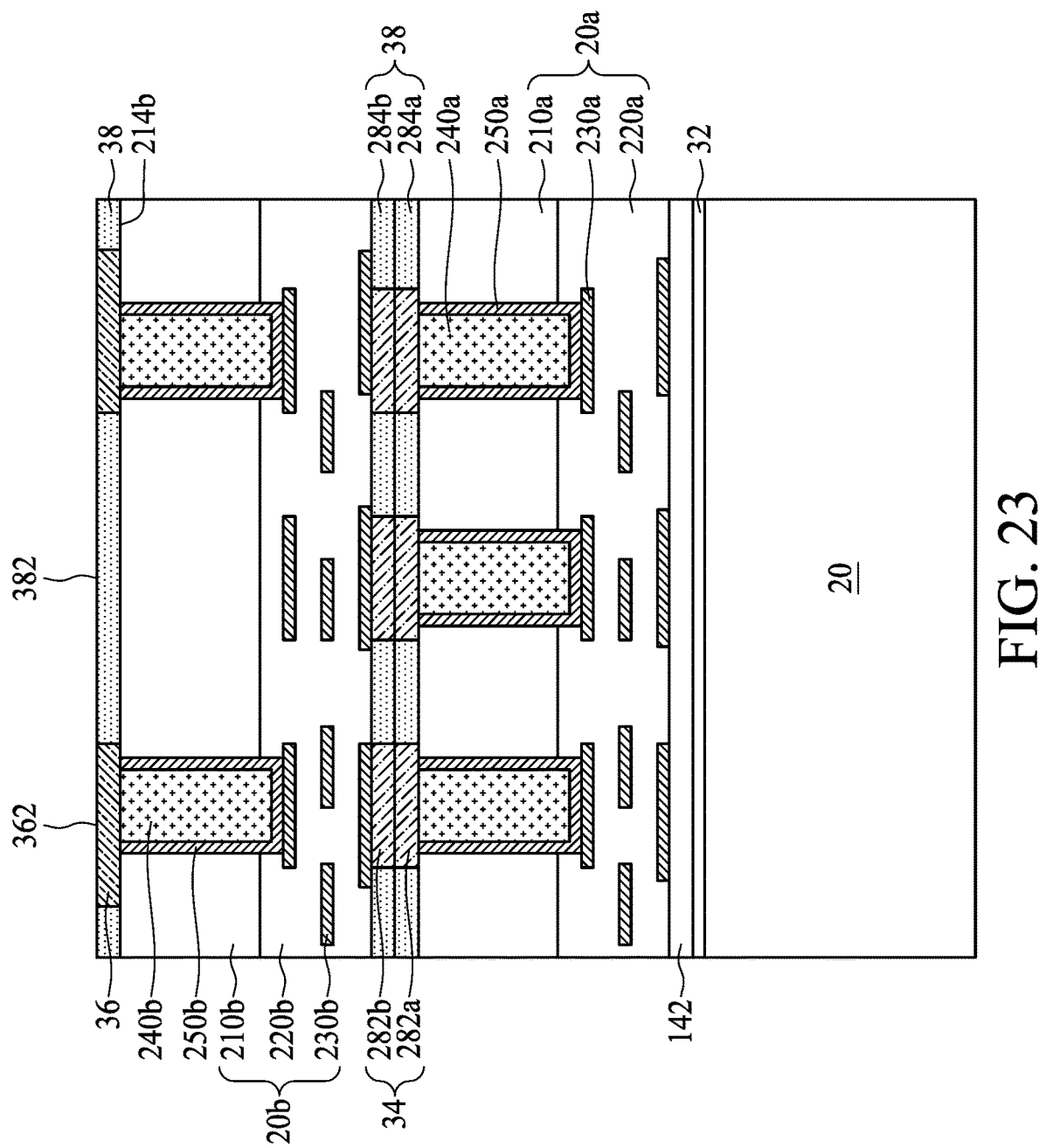

Next, a second mask 640 is provided on the third precursor layer 300 to define a pattern of a second redistribution layer 36 as shown in FIG. 23. In some embodiments, the second interconnect structures 240b are disposed beneath the second mask 640.

Referring again to FIG. 23, in some embodiments, a third patterning process is performed to etch the third precursor layer 300 through the second mask 620 and expose a portion of the second back surface 214b according to a step 542 in FIG. 3. Accordingly, a second redistribution layer 36 is formed. After the third patterning process is performed, the second mask 640 is removed. In some embodiments, the second redistribution layer 36 is formed by removing the portion of the third precursor layer 300 exposed through the second mask 640. In some embodiments, portions of the second back surface 214a are covered by the second redistribution layer 36.

Next, the dielectric layer 38 is deposited to cover portions of the second back surface 214b exposed through the second redistribution layer 36 and to surround the second redistribution layer 36 according to a step 544 in FIG. 3. In some embodiments, the redistribution layer 36 has a top surface 362, and the dielectric layer 38 has a top surface 382 coplanar with the top surface 362 of the redistribution layer 36. In some embodiments, the materials and formation methods of the dielectric layer 38 are essentially the same as those of the first dielectric layer 284a and the second dielectric layer 284b.

Figure 24:
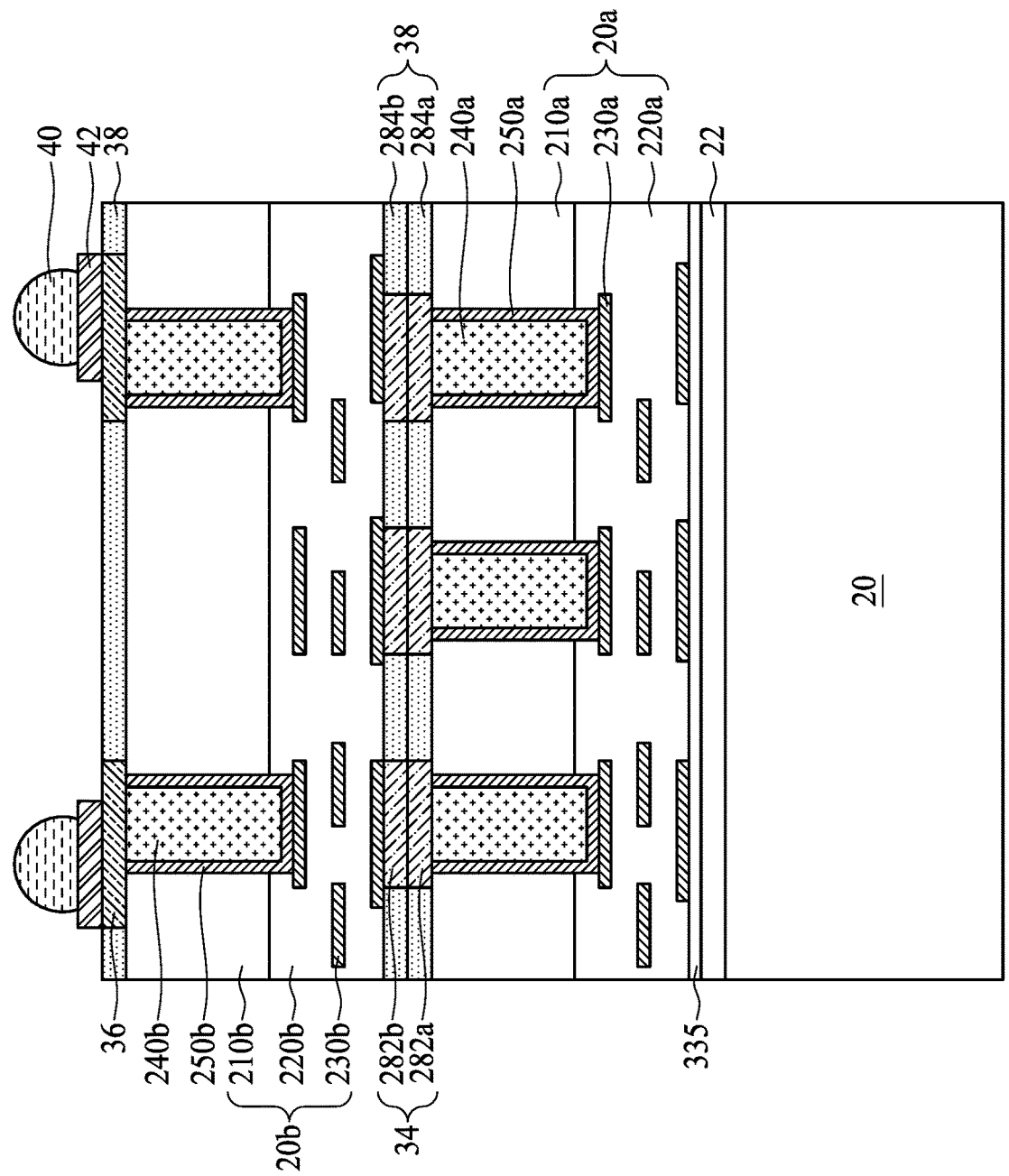

Referring to FIG. 24, in some embodiments, one or more UBM members 42 are formed on the second redistribution layer 36, and one or more solder bumps 40 are disposed on the UBM members 42 according to a step 546 in FIG. 3. In some embodiments, the solder bumps 40 are mounted by initially placing a solder flux (not shown) on the UBM members 42. The solder flux generally has an acidic component that removes oxide barriers, and an adhesive quality that helps to prevent movement during the process. Once the solder bumps 40 are in contact with the solder flux, a reflow may be performed to reflow the material of the solder bumps 40 and the solder flux to physically bond the solder bumps 40 to the UBM members 42.

Figure 25:
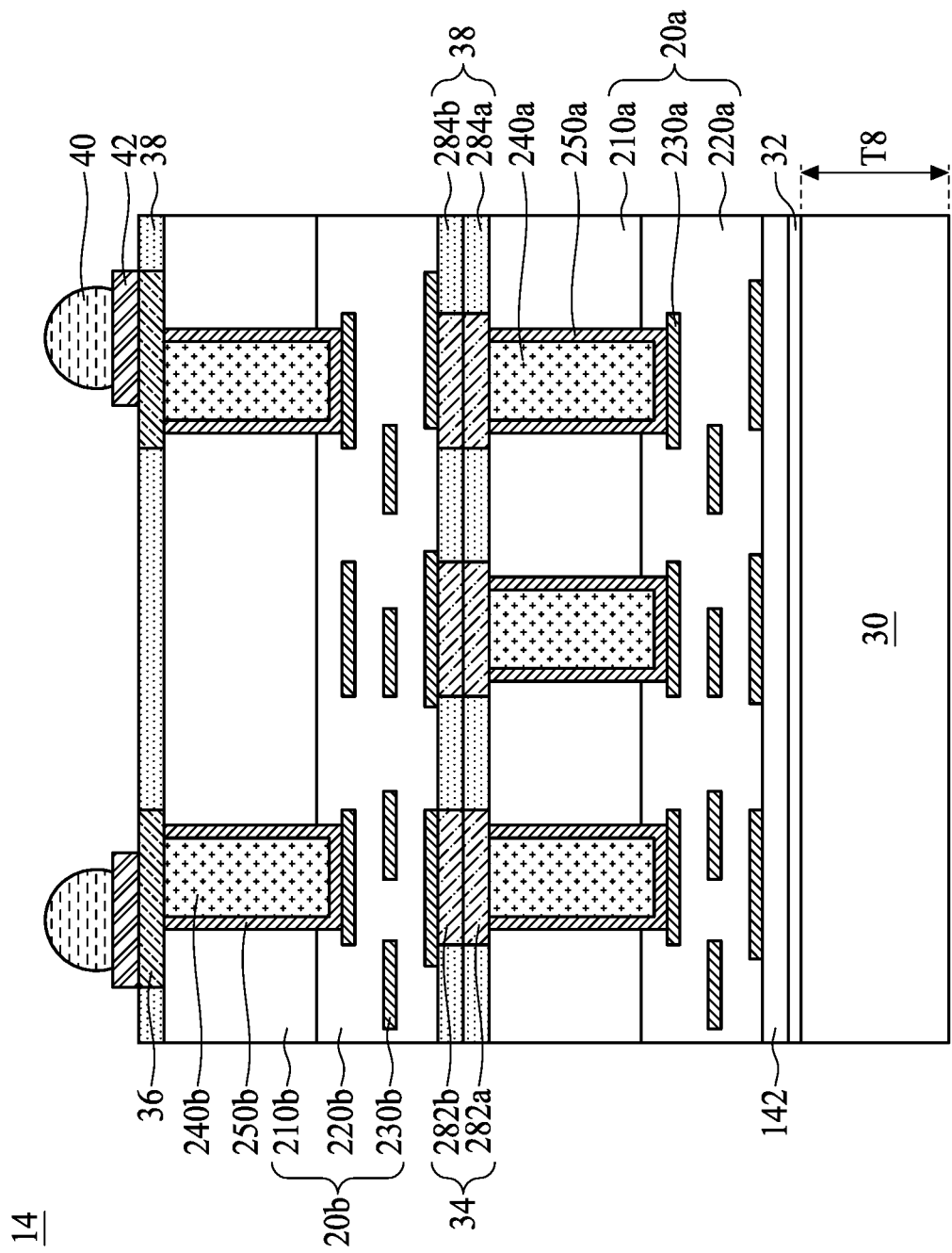

Referring to FIG. 25, in some embodiments, a grinding process is performed to thin the carrier 30 according to a step 548 in FIG. 3. Accordingly, the semiconductor device 14 is completely formed. In some embodiments, the carrier 30 is thinned to a thickness T8, such as less than or equal to about 50 μm.

One aspect of the present disclosure provides a semiconductor device. The semiconductor device includes a first die, a second die, a first redistribution layer, a second redistribution layer, a first interconnect structure and a second interconnect structure. The first die include a first substrate, a first inter-layer dielectric (ILD) layer disposed on a front surface of the first substrate, and a plurality of first metal lines disposed in the first ILD layer. The second die is stacked on the first die. The second die includes a second substrate, a second ILD layer disposed on a second front surface of the second substrate, and a plurality of second metal lines disposed in the second ILD layer. The first redistribution layer is disposed between the first substrate and the second ILD layer. The second redistribution layer is disposed on the second substrate. The first interconnect structure penetrates through the first substrate and into the first ILD layer to connect the first redistribution layer to one of the first metal lines. The second interconnect structure penetrates through the second substrate and into the second ILD layer to connect the second redistribution layer to one of the second metal lines.

One aspect of the present disclosure provides a method of manufacturing a semiconductor device. The method includes steps of providing a first die comprising a first substrate, a first ILD layer disposed on a first front surface of the first substrate, and a plurality of first metal lines disposed in the first ILD layer; forming a first interconnect structure penetrating through the first substrate and into the first ILD layer and contacting one of the first metal lines; forming a first re-routing layer physically connected to the first interconnect structure; providing a second die comprising a second substrate, a second ILD layer disposed on a second front surface of the second substrate, and a plurality of second metal lines in the second ILD layer; forming a second re-routing layer physically connected to one of the second metal lines; stacking the second die on the first die and physically connecting the first re-routing layer to the second re-routing layer; forming a second interconnect structure penetrating through the second substrate and into the second ILD layer and contacting one of the second conductors; and forming a second redistribution layer on the second substrate and physically connected to the second interconnect structure.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods and steps.

What is claimed is:

1. A semiconductor device, comprising:
   a first die comprising a first substrate, a first inter-layer dielectric (ILD) layer disposed on a front surface of the first substrate, and a plurality of first metal lines disposed in the first ILD layer;
   a second die stacked on the first die and comprising a second substrate, a second ILD layer disposed on a second front surface of the second substrate, and a plurality of second metal lines disposed in the second ILD layer;
   a first redistribution layer between the first substrate and the second ILD layer;
   a second redistribution layer disposed on the second substrate;

a first interconnect structure penetrating through the first substrate and into the first ILD layer to connect the first redistribution layer to one of the first metal lines; and a second interconnect structure penetrating through the second substrate and into the second ILD layer to connect the second redistribution layer to one of the second metal lines;

wherein the first redistribution layer has a first thickness, and the second redistribution layer has a second thickness less than the first thickness.

2. The semiconductor device of claim 1, wherein the first redistribution layer is aligned with the first interconnect structure and is offset from the second metal line when viewed in a cross-sectional view.

3. The semiconductor device of claim 1, wherein the second metal line physically connected to the first redistribution layer is exposed to the second ILD layer.

4. The semiconductor device of claim 1, further comprising at least one solder bump electrically coupled to the second redistribution layer.

5. The semiconductor device of claim 4, further comprising at least one under bump metallization (UBM) member sandwiched between the solder bump and the second redistribution layer.

6. The semiconductor device of claim 1, further comprising a carrier bonded to the first die through a bonding layer.

7. The semiconductor device of claim 6, wherein the bonding layer comprises a native dielectric film grown on the carrier and a deposited dielectric layer on the first ILD layer.

* * * * *